United States Patent
Ohkawara et al.

(10) Patent No.: US 8,594,231 B2
(45) Date of Patent: Nov. 26, 2013

(54) POWER SERIES DIGITAL PREDISTORTER AND DISTORTION COMPENSATION CONTROL METHOD THEREFOR

(75) Inventors: Junya Ohkawara, Yokohama (JP);
Yasunori Suzuki, Yokohama (JP);
Shoichi Narahashi, Yokohama (JP)

(73) Assignee: NTT DoCoMo, Inc., Tokyo (JP)

( * ) Notice: Subject to any disclaimer, the term of this patent is extended or adjusted under 35 U.S.C. 154(b) by 397 days.

(21) Appl. No.: 12/868,063

(22) Filed: Aug. 25, 2010

(65) Prior Publication Data

US 2011/0050339 A1   Mar. 3, 2011

(30) Foreign Application Priority Data

Aug. 27, 2009  (JP) .................... 2009-197292
Jul. 5, 2010  (JP) .................... 2010-152769

(51) Int. Cl.
*H04K 1/02* (2006.01)
*H04L 25/49* (2006.01)

(52) U.S. Cl.
USPC ............ 375/297; 375/296; 375/298; 375/149

(58) Field of Classification Search
USPC .................... 375/297, 298, 299; 330/149
See application file for complete search history.

(56) References Cited

U.S. PATENT DOCUMENTS

| | | | |
|---|---|---|---|
| 7,042,286 B2 * | 5/2006 | Meade et al. | 330/149 |
| 7,053,709 B1 * | 5/2006 | Darvish-Zadeh et al. | 330/149 |
| 7,197,085 B1 * | 3/2007 | Vella-Coleiro | 375/296 |
| 7,251,293 B2 * | 7/2007 | Vella-Coleiro | 375/297 |
| 7,899,416 B2 * | 3/2011 | McCallister et al. | 455/114.3 |
| 2002/0085647 A1 * | 7/2002 | Oishi et al. | 375/297 |
| 2003/0184373 A1 * | 10/2003 | Cameron et al. | 330/149 |
| 2004/0116083 A1 * | 6/2004 | Suzuki et al. | 455/126 |
| 2005/0195030 A1 * | 9/2005 | Okazaki et al. | 330/149 |

FOREIGN PATENT DOCUMENTS

JP   2006-352852   12/2006

OTHER PUBLICATIONS

Shinji Mizuta, et al. "A New Adjustment Method for the Frequency-Dependent IMD Compensator of the Digital Predistortion Linearizer", IEEE Radio and Wireless Symposium 2006, Jan. 2006. pp. 255-258.

Toshio Nojima, et al. "Predistortion Nonlinear Compensator for Microwave SSB-AM System", IEICE Transactions, vol. J67-B, No. 1, Jan. 1984 (With Partial English Translation), 13 pages.

(Continued)

*Primary Examiner* — Qutbuddin Ghulamali
(74) *Attorney, Agent, or Firm* — Oblon, Spivak, McClelland, Maier & Neustadt, L.L.P.

(57) ABSTRACT

A power series digital predistorter and a distortion compensation control method for the power series digital predistorter are capable of adjusting the coefficients of a frequency characteristic compensator at high speed. A controller in the power series digital predistorter collectively sets adjustment amounts for the phases in bands in an N-th order frequency characteristic compensator; collectively sets adjustment amounts for the amplitudes in the bands in the N-th order frequency characteristic compensator; determines whether an index indicating the degree of cancellation of a distortion component generated in a power amplifier satisfies a preset condition; and, if the index does not satisfy the condition, performs control such that the adjustment amounts for the phases and the adjustment amounts for the amplitudes are set again.

8 Claims, 26 Drawing Sheets

(56) References Cited

OTHER PUBLICATIONS

Junya Ohkawara, et al. "Fast Calculation Scheme for Frequency Characteristic Compensator of Digital Predistortion Linearizer", IEEE Vehicular Technology Conference 2009, VTC Spring 2009, proceedings IEEE 69th, Apr. 2009. pp. 1-5.

Japanese Office Action issued Jan. 29, 2013 in Japanese Application No. 2010-152769 with English translation, 6 pages.

* cited by examiner

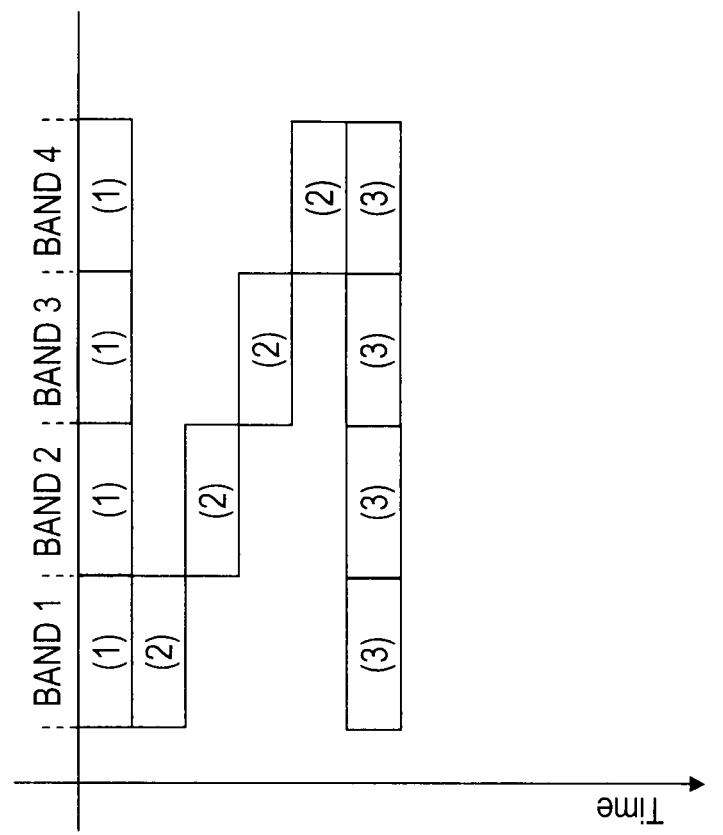
FIG.13B  Method B
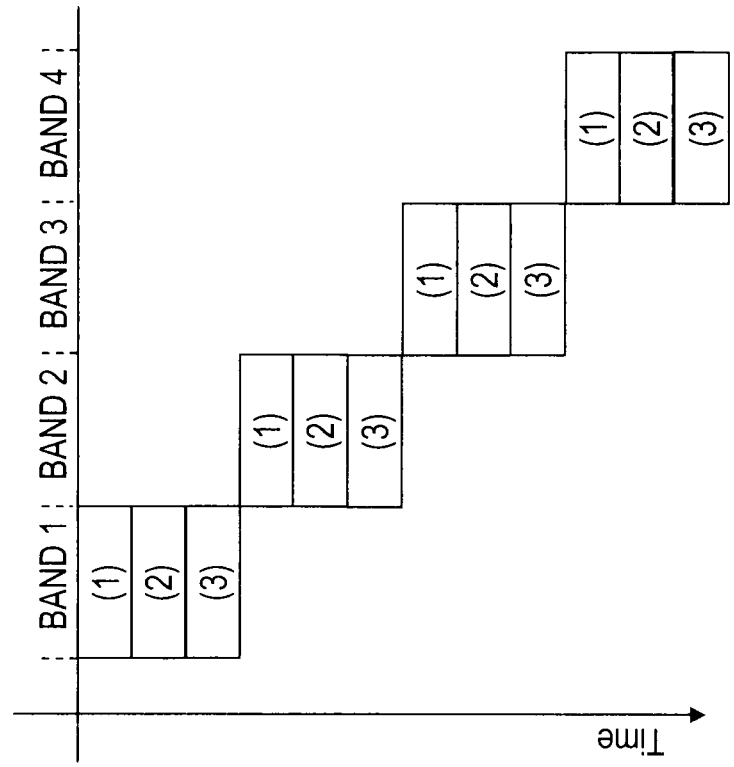
FIG.13A  Method A

POWER SERIES DIGITAL PREDISTORTER AND DISTORTION COMPENSATION CONTROL METHOD THEREFOR

TECHNICAL FIELD

The present invention relates to a power series digital predistorter and a distortion compensation control method therefor.

BACKGROUND ART

Nonlinear distortion compensation methods for microwave power amplifiers (power amplifiers hereafter) include a predistortion method. The predistortion method uses a predistorter to add, to a power amplifier input signal beforehand, a distortion compensation component for cancelling out a distortion component generated by the power amplifier.

The power amplifier generally provides high efficiency when it is operated at around the saturation output power. As the power amplifier approaches its saturation output power, the intermodulation distortion (distortion component hereafter) increases because of the nonlinear characteristics. In addition, the distortion component has frequency dependent. Predistorters that can compensate for the frequency dependent distortion component include a power series digital predistorter (digital predistorter hereafter) that compensates for the frequency dependence of the distortion component (refer to S. Mizuta, Y. Suzuki, S. Narahashi, and Y. Yamao, "A New Adjustment Method for the Frequency-Dependent IMD Compensator of the Digital Predistortion Linearizer," IEEE Radio and Wireless Symposium 2006, pp. 255-258, January 2006.).

FIG. 1 shows a conventional structure of a digital predistorter 900 and its peripheral equipment. In the example shown, a digital input transmission signal includes an I-phase signal and a Q-phase signal (I/Q signals hereafter). The digital predistorter 900 includes a linear transfer path 901A, a distortion generation path 901B, dividers 902, combiners 903, digital-to-analog converters (DACs) 904, analog-to-digital converters (ADCs) 905, an distortion observer 906, and a controller 907. The linear transfer path 901A includes a delay unit 901A1. The distortion generation path 901B includes a distortion generator 901B1, a distortion vector adjuster 901B2, and a frequency characteristic compensator 901B3. The dividers 902 divide the input transmission signal into the linear transfer path 901A and the distortion generation path 901B. The combiners 903 combine the outputs of the linear transfer path 901A and the outputs of the distortion generation path 901B. The digital-to-analog converters (DACs) 904 convert the outputs of the combiners 903 (digital I/Q signals with distortion compensation components added thereto) to analog I/Q signals. The analog-to-digital converters (ADCs) 905 convert the outputs (analog I/Q signals) of a feedback signal generator 960 that takes in a part of the output of an amplifier 950 as a feedback signal to digital I/Q signals. The distortion observer 906 detects a distortion component from the outputs of the ADCs 905. The controller 907 adjusts vector coefficients (amplitude and phase) to be set in the distortion vector adjuster 901B2 and one or more frequency characteristic compensator coefficients (amplitude and phase) to be set in the frequency characteristic compensator 901B3, in accordance with the output of the distortion observer 906.

The amplifier 950 includes a quadrature modulator 951 for performing quadrature modulation of the analog I/Q signals output from the digital predistorter 900, a frequency upconverter 952 for converting the frequency of the modulated output to the carrier frequency, and a power amplifier 953 for performing power amplification of the frequency-converted signal, and supplies the power-amplified signal from an output terminal 970 to an antenna, for example, via a duplexer, not shown.

The feedback signal generator 960 includes a coupler 961 that extracts a part of the output of the amplifier 950 as a feedback signal, a frequency downconverter 962 for converting the frequency of the feedback signal, and a quadrature demodulator 963 for performing quadrature demodulation of the down-converted feedback signal.

FIG. 2 shows an example structure of the frequency characteristic compensator 901B3. The frequency characteristic compensator 901B3 includes a J-point FFT 901B31, a complex multiplier 901B32, and a J-point IFFT 901B33. The FFT 901B31 converts the input signal of the frequency characteristic compensator 901B3 into the frequency domain. The complex multiplier 901B32 multiplies each of M bands formed by dividing the upper band and lower band of the distortion component, as shown in FIG. 3, by a frequency characteristic compensator coefficient given by the controller 907 (phase and amplitude adjustment). The output of the FFT 901B31 outside the divided bands is directly input to the IFFT 901B33, which is not shown in the figure. The IFFT 901B33 converts the output of the complex multiplier 901B32 into the time domain.

FIG. 4 shows a flowchart illustrating processing for frequency characteristic compensator coefficients that minimize the distortion component, in the frequency characteristic compensator. The controller 907 specifies one band where the frequency characteristic compensator coefficient is to be adjusted (band specification step S900), adjusts the frequency characteristic compensator coefficient to reduce the power of the distortion component in the specified band to the minimum level (or a target value), and sets the coefficient in the frequency characteristic compensator (frequency characteristic compensator coefficient adjustment steps S901, S902). When the distortion component power in the specified band is minimized (condition 1) and when the distortion component power in each of all bands is minimized (condition 2), the controller 907 ends the frequency characteristic compensator coefficient adjustment process and sets the obtained frequency characteristic compensator coefficients in the frequency characteristic compensator (S903). If the conditions 1 and 2 are not satisfied, the controller 907 goes back to the band specification step and repeats the steps S900, S901, and S902 until the conditions 1 and 2 are satisfied (S903). By adjusting the frequency characteristic compensator coefficients in all bands in accordance with the processing as described above, the frequency-dependent distortion component is compensated for.

SUMMARY OF THE INVENTION

If the frequency dependence of the distortion component varies greatly, the number of bands of the frequency characteristic compensator must be increased to perform high-precision distortion compensation. When the conventional digital predistorter 900 as shown in FIGS. 1 to 4 is used to adjust the frequency characteristic compensator coefficients (phase and amplitude), the adjustment time increases as the number of bands increases, because the frequency characteristic compensator coefficients are adjusted band by band (see FIGS. 2 and 4, especially). For example, if the frequency characteristic compensator 901B3 has eight bands, the time required to adjust the frequency characteristic compensator coefficients of all the bands once is twice the time required by a frequency characteristic compensator having four bands.

It is an object of the present invention to provide a power series digital predistorter and a distortion compensation control method therefor that can quickly adjust frequency characteristic compensator coefficients (phase and amplitude).

A power series digital predistorter according to the present invention adds to an input signal a distortion compensation component for cancelling a distortion component generated in a power amplifier. The power series digital predistorter includes a linear transfer path adapted to transfer the input signal with a delay; a distortion generation path outputting the output of an N-th order frequency characteristic compensator as the distortion compensation component, where N is a predetermined odd number equal to or larger than three; a combiner adapted to combine the output of the linear transfer path and the output of the distortion generation path; a distortion observer adapted to observe the distortion component included in the output of the power amplifier, which is adapted to amplify the output of the combiner; and a controller adapted to set adjustment amounts for the amplitude and the phase in each of M bands in the N-th order frequency characteristic compensator according to an observation result of the distortion observer, where M is a predetermined integer equal to or larger than two. The distortion generation path includes an N-th order distortion generator adapted to generate an N-th order distortion component of the input signal; an N-th order distortion vector adjuster adapted to adjust the amplitude and the phase of the N-th order distortion component; and the N-th order frequency characteristic compensator, which is adapted to divide the output of the N-th order distortion vector adjuster into the M bands in the frequency domain and to adjust the amplitude and the phase of the output in each of the M bands. The controller includes a phase setting unit adapted to collectively set the adjustment amounts for the phases in the M bands in the N-th order frequency characteristic compensator; an amplitude setting unit adapted to collectively set the adjustment amounts for the amplitudes in the M bands in the N-th order frequency characteristic compensator; and a processing control unit. The processing control unit is adapted to determine whether an index indicating the degree of cancellation of the distortion component generated in the power amplifier satisfies a preset condition, and, if the index does not satisfy the condition, to perform control such that the phase setting unit again collectively sets the adjustment amounts for the phases and the amplitude setting unit again collectively sets the adjustment amounts for the amplitudes.

A distortion compensation control method for a power series digital predistorter, according to the present invention includes a phase setting step of collectively setting adjustment amounts for the phases in bands in an N-th order frequency characteristic compensator; an amplitude setting step of collectively setting adjustment amounts for the amplitudes in the bands in the N-th order frequency characteristic compensator; and a processing control step of determining whether an index indicating the degree of cancellation of a distortion component generated in a power amplifier satisfies a preset condition, and, if the index does not satisfy the condition, of performing control such that the phase setting step and the amplitude setting step are performed again.

EFFECTS OF THE INVENTION

According to the present invention, since the phases and the amplitudes are collectively set in all the bands of the distortion component in the frequency characteristic compensator, the frequency characteristic compensator coefficients can be adjusted at high speed.

BRIEF DESCRIPTION OF THE DRAWINGS

FIG. 13A shows a processing flow of a phase adjustment in a conventional method;

FIG. 13B shows a processing flow of a phase adjustment in the first embodiment;

DETAILED DESCRIPTION OF THE EMBODIMENTS

With reference to the drawings, embodiments of the present invention will be described next.

First Embodiment

Figure 5:
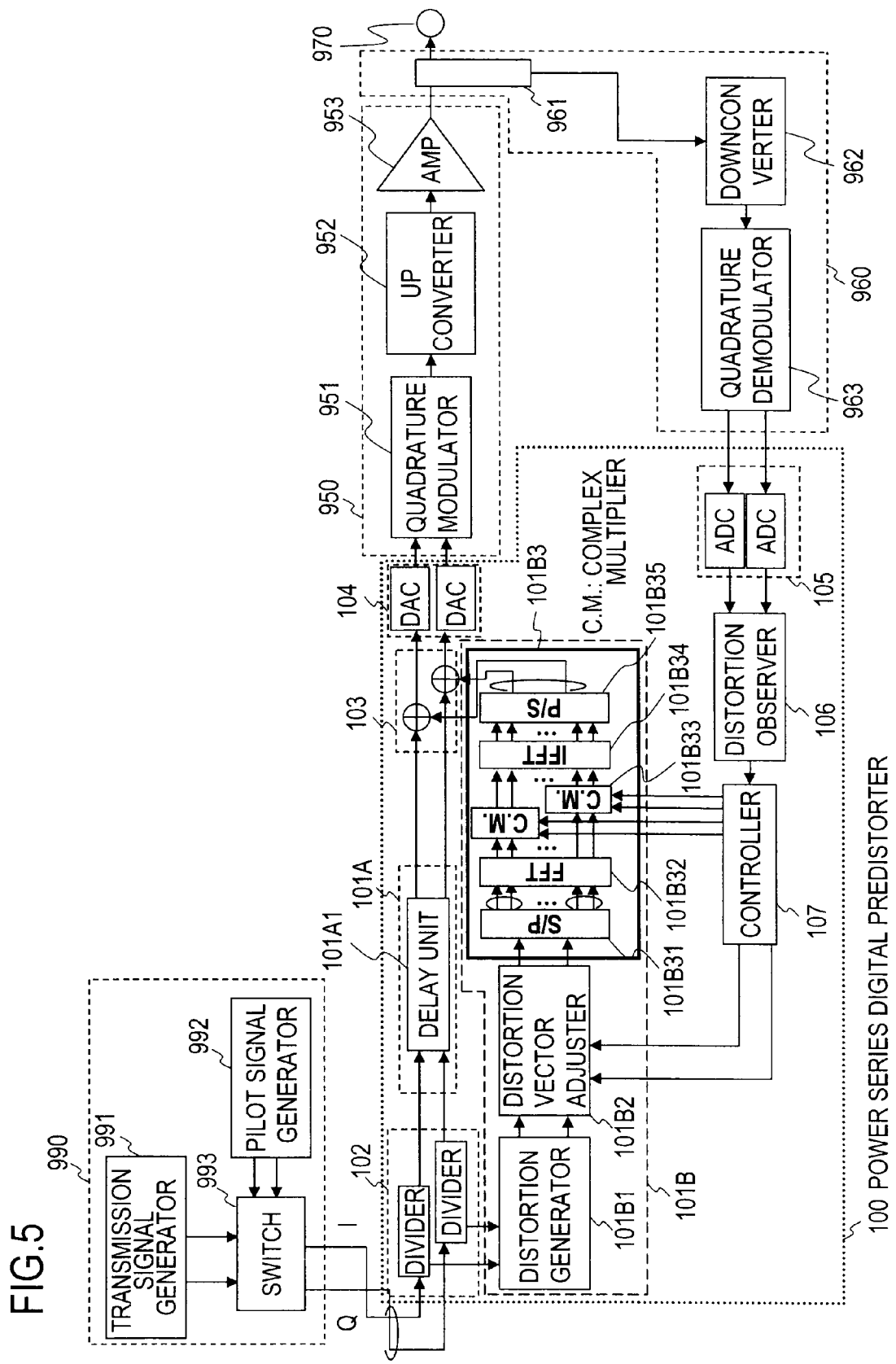
FIG. 5 is a block diagram of a power series digital predistorter according to a first embodiment.

FIG. 5 shows the structure of a power series digital predistorter 100 of a first embodiment of the present invention and its peripheral equipment. The peripheral equipment shown in FIG. 5 includes a digital predistorter input signal generator 990, an amplifier 950, and a feedback signal generator 960 which takes in a part of the output of the amplifier 950 and generates a feedback signal for the power series digital predistorter 100. The amplifier 950 and the feedback signal generator 960 are the same as the peripheral equipment of the digital predistorter 900, which has been described as the related art, and therefore, a repeated description will be omitted (see the foregoing description).

The digital predistorter input signal generator 990 includes a transmission signal generator 991, a pilot signal generator 992, and a switch 993 for selecting the output of the transmission signal generator 991 or the output of the pilot signal generator 992. The digital input transmission signal output from the transmission signal generator 991 includes desired information. The pilot signal output by the pilot signal generator 992 is used when frequency characteristic compensator coefficients, which will be described later, are determined. The frequency and the like of the pilot signal are not especially limited. In the first embodiment, the digital input transmission signal and the pilot signal include the I-phase signal and the Q-phase signal (I/Q signals) each.

The power series digital predistorter 100 in the first embodiment includes a linear transfer path 101A, an N-th order distortion generation path 101B, dividers 102, combiners 103, digital-to-analog converters (DACs) 104, analog-to-digital converters (ADCs) 105, a distortion observer 106, and a controller 107. The linear transfer path 101A includes a delay unit 101A1. The N-th order distortion generation path 101B includes an N-th order distortion generator 101B1, an N-th order distortion vector adjuster 101B2, and an N-th order frequency characteristic compensator 101B3. The dividers 102 divide the I-phase signal and the Q-phase signal into the linear transfer path 101A and the N-th order distortion generation path 101B. The combiners 103 combine the outputs of the linear transfer path 101A and the outputs of the N-th order distortion generation path 101B for the I-phase signal and the Q-phase signal. The digital-to-analog converters (DACs) 104 convert the I-phase signal and the Q-phase signal output from the combiners 103 (digital I/Q signals with distortion compensation signals added thereto) separately to analog I/Q signals. The analog-to-digital converters (ADCs) 105 convert the outputs (analog I/Q signals) of the feedback signal generator 960 which takes in a part of the output of the amplifier 950 as the feedback signal, to digital I/Q signals. The distortion observer 106 observes the outputs (digital I/Q signals) of the ADCs 105 and measures the power in the transmission signal band and the power of the N-th order distortion component generated by the amplifier 950 in bands divided by the N-th order frequency characteristic compensator 101B3. The controller 107 adjusts the vector coefficients (amplitude and phase) to be set in the N-th order distortion vector adjuster 101B2 and one or more frequency characteristic compensator coefficients (amplitude and phase) to be set in the N-th order frequency characteristic compensator 101B3, in accordance with the output of the distortion observer 106. Here, N is a predetermined odd number equal to or larger than 3. In this example, N is 3.

Figure 6:
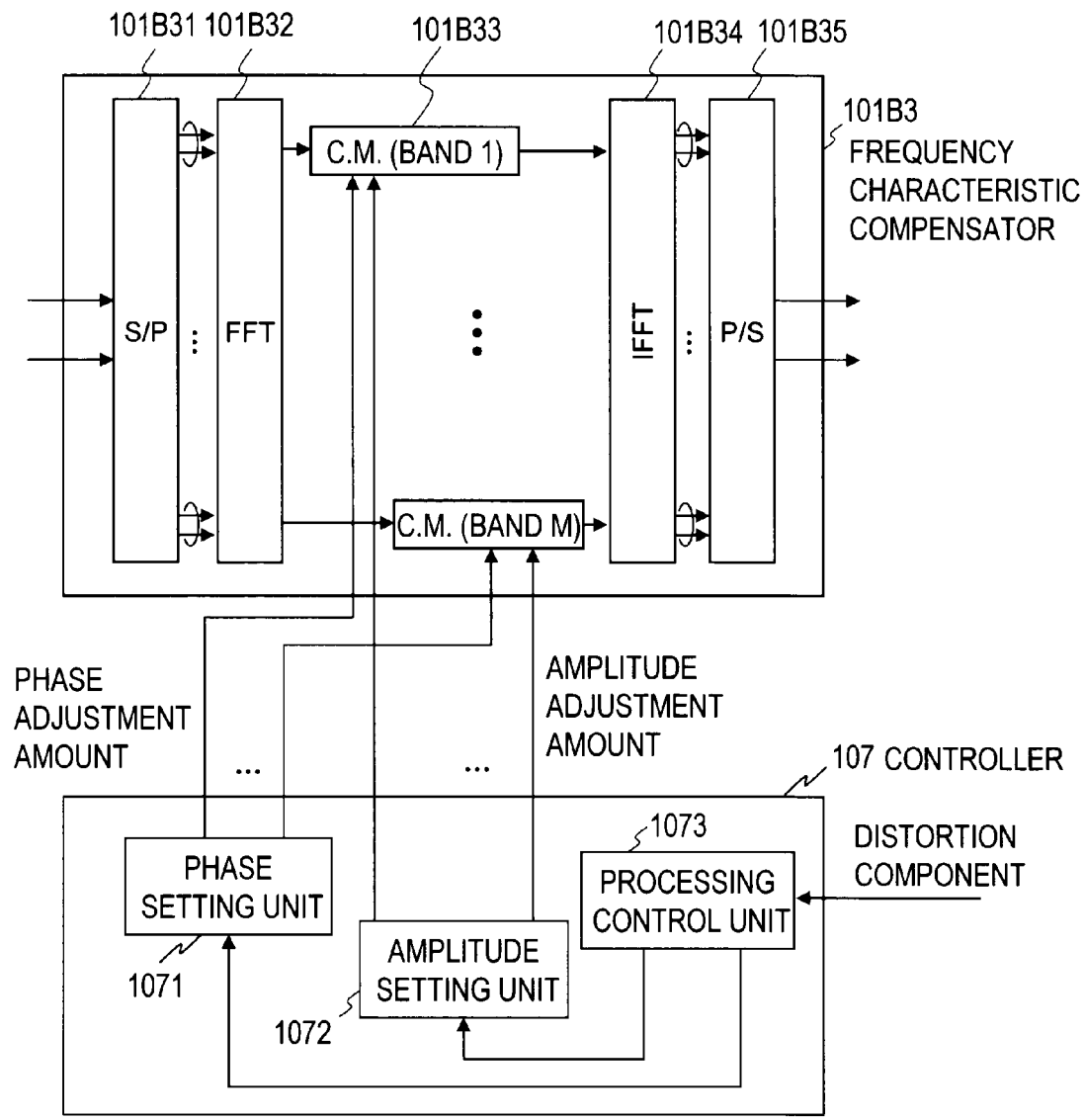
FIG. 6 is a functional structural diagram of a controller.

The controller 107 includes a phase setting unit 1071, an amplitude setting unit 1072, and a processing control unit 1073 (see FIG. 6). The phase setting unit 1071 sets the phase adjustment amounts of M distortion component bands collectively in the third-order frequency characteristic compensator 101B3. The amplitude setting unit 1072 sets the amplitude adjustment amounts of M distortion component bands (M is a predetermined integer equal to or larger than 2) collectively in the third-order frequency characteristic compensator 101B3. The processing control unit 1073 judges whether an index (ACLR, for example, as described later) indicating the degree of cancellation of the distortion component generated by the power amplifier 953 satisfies a predetermined condition (lower than or lower than or equal to the target value). If the condition is not satisfied, the phase setting unit 1071 is controlled to set the phase adjustment amounts again, and the amplitude setting unit 1072 is controlled to set the amplitude adjustment amounts again.

In the first embodiment, just the third-order distortion component is the target of compensation. If one or more different W-th order distortion generation paths (W is an odd number equal to or larger than 5) are connected in parallel to the third-order distortion generation path 101B, a plurality of odd-order distortion components can become the compensation target.

Figure 1:
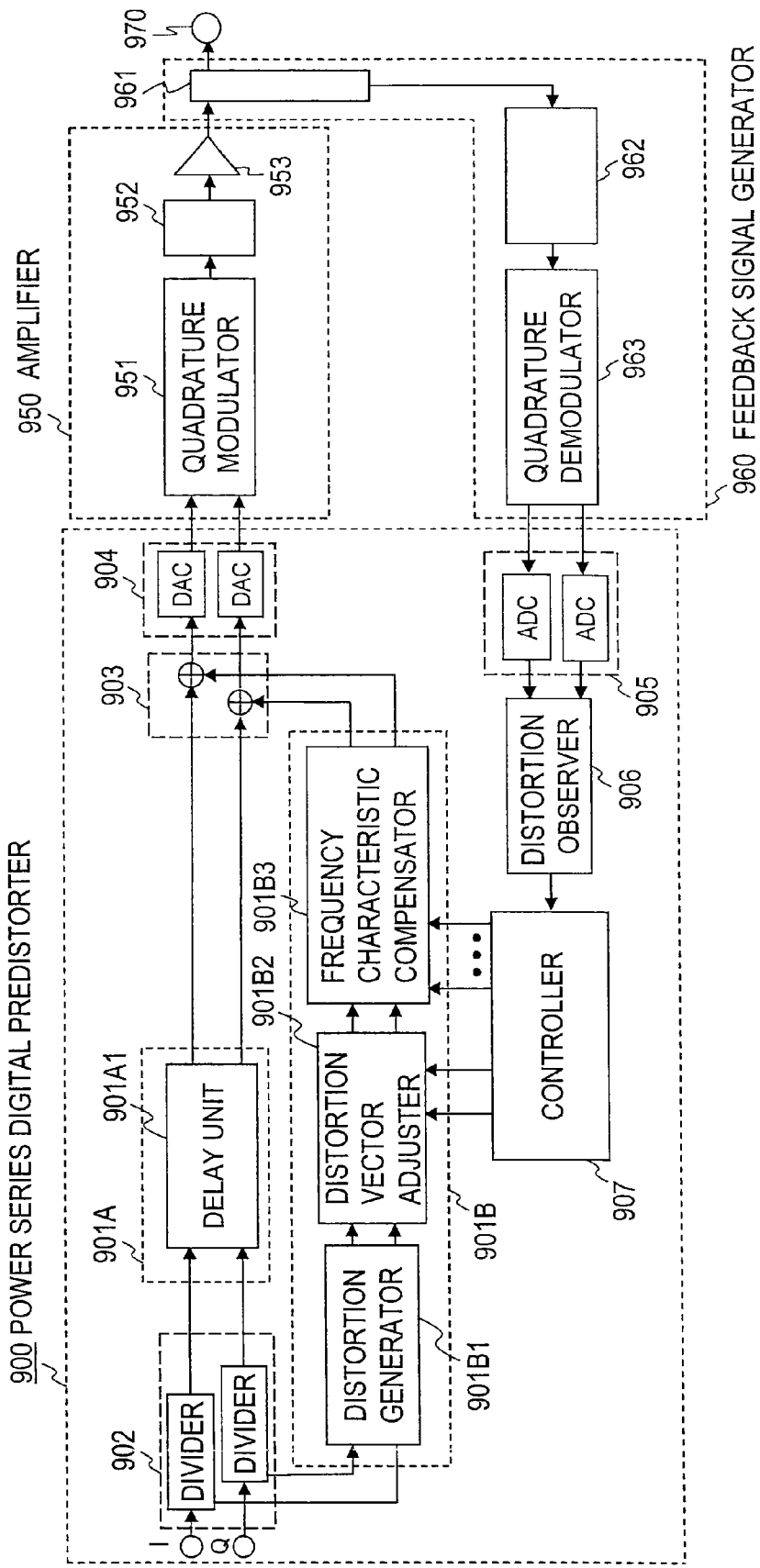
FIG. 1 is a block diagram showing an example structure of a conventional power series digital predistorter.
Figure 2:
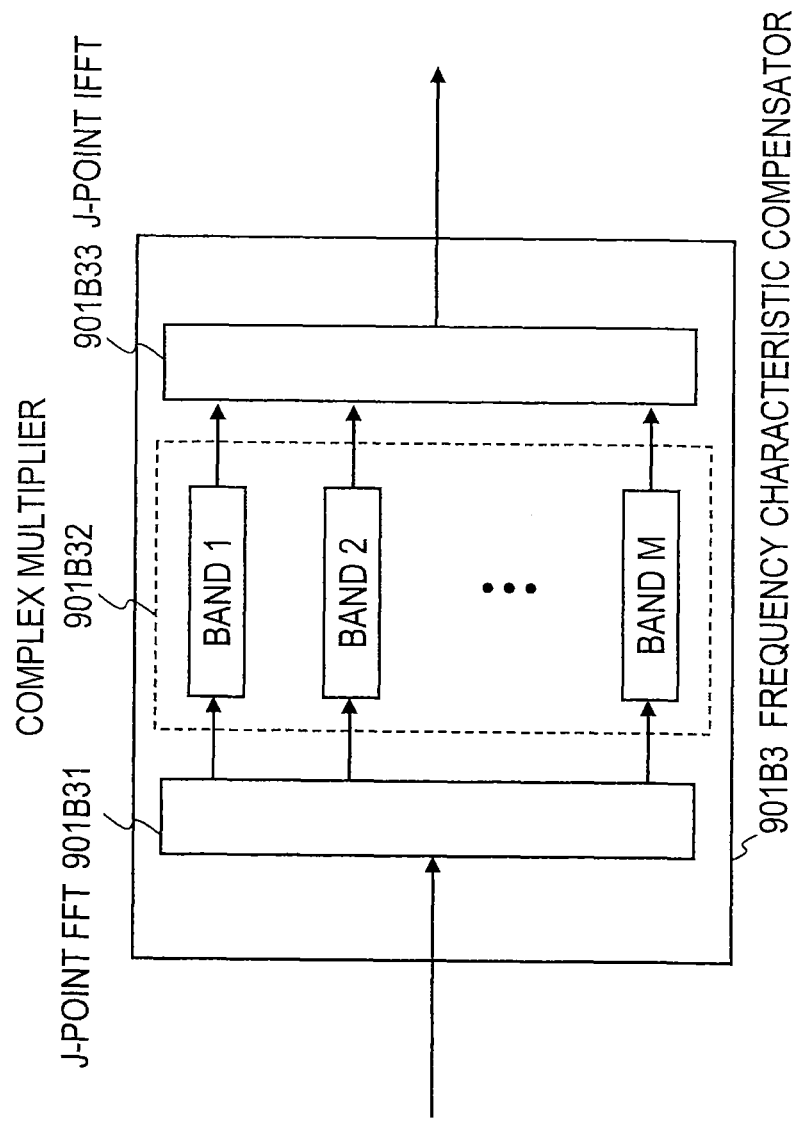
FIG. 2 is a block diagram showing an example structure of a frequency characteristic compensator.
Figure 3:
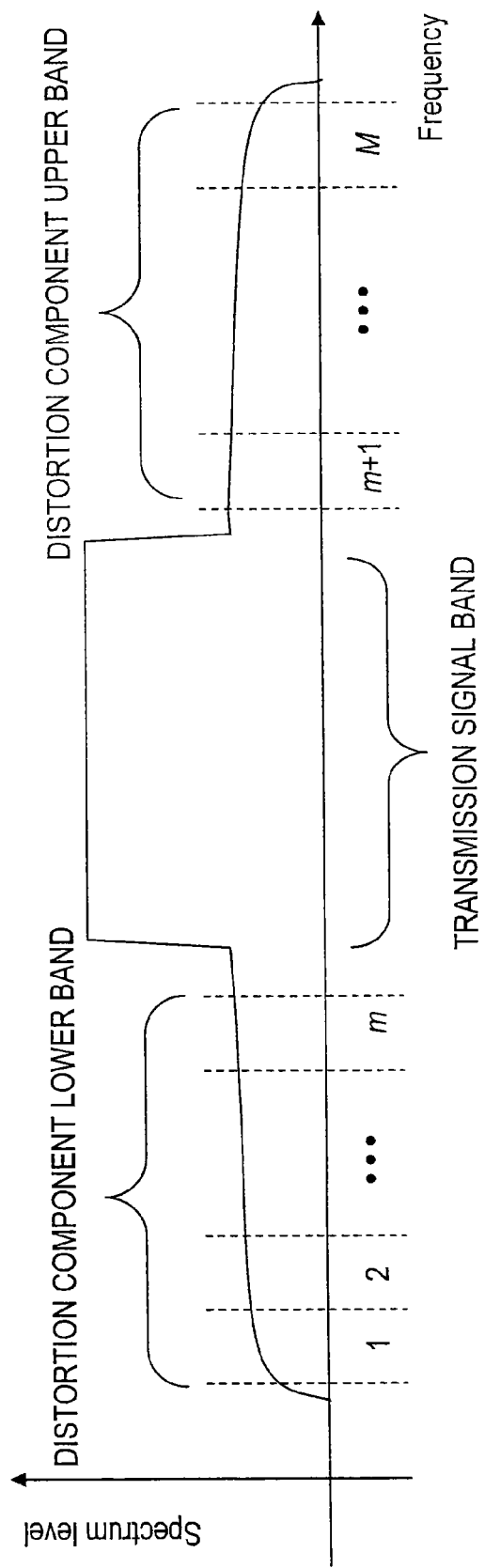
FIG. 3 is a diagram showing an example band division in the frequency characteristic compensator.
Figure 4:
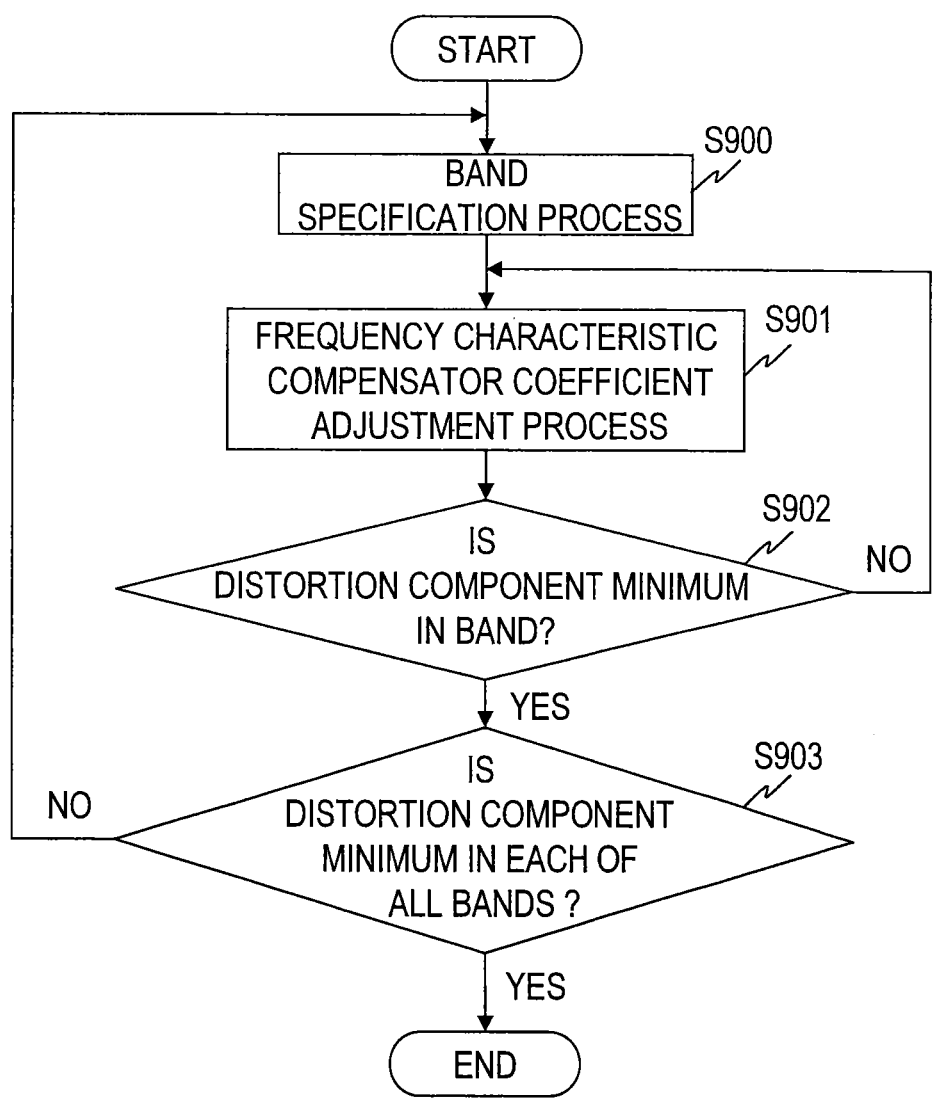
FIG. 4 is a flowchart of a control method for the conventional frequency characteristic compensator.

The third-order frequency characteristic compensator 101B3 converts the outputs of the third-order distortion vector adjuster 101B2 into the frequency domain and divides the upper and lower third-order distortion component bands into M parts, as shown in FIG. 3. The third-order frequency characteristic compensator 101B3 includes a serial-to-parallel converter (S/P) 101B31, a fast Fourier transformer (FFT) 101B32, a complex multiplier (C.M.) 101B33, an inverse fast Fourier transformer (IFFT) 101B34, and a parallel-to-serial converter (P/S) 101B35. The S/P 101B31 converts the outputs of the third-order distortion vector adjuster 101B2 from serial to parallel. The FFT 101B32 converts the outputs of the S/P 101B31 into the frequency domain. The complex multiplier 101B33 adjusts the phase and amplitude by multiplying them by the frequency characteristic compensator coefficients given by the controller 107 in each of the M divided bands. The IFFT 101B34 converts the outputs of the complex multiplier 101B33 into the time domain. The P/S 101B35 converts the outputs of the IFFT 101B34 from parallel to serial. The third-order frequency characteristic compensator 101B3 adjusts the phase and amplitude in each of the M divided bands by using the frequency characteristic compensation coefficients (phase and amplitude) specified by the controller 107.

The input signals of the digital predistorter 100 are the outputs (pilot signals) of the pilot signal generator 992 until the third-order distortion components are minimized (to the target value or below). After the third-order distortion components are minimized (to the target value or below), the switch 993 selects the outputs (transmission signals) of the transmission signal generator 991 as the input signals.

Figure 7:
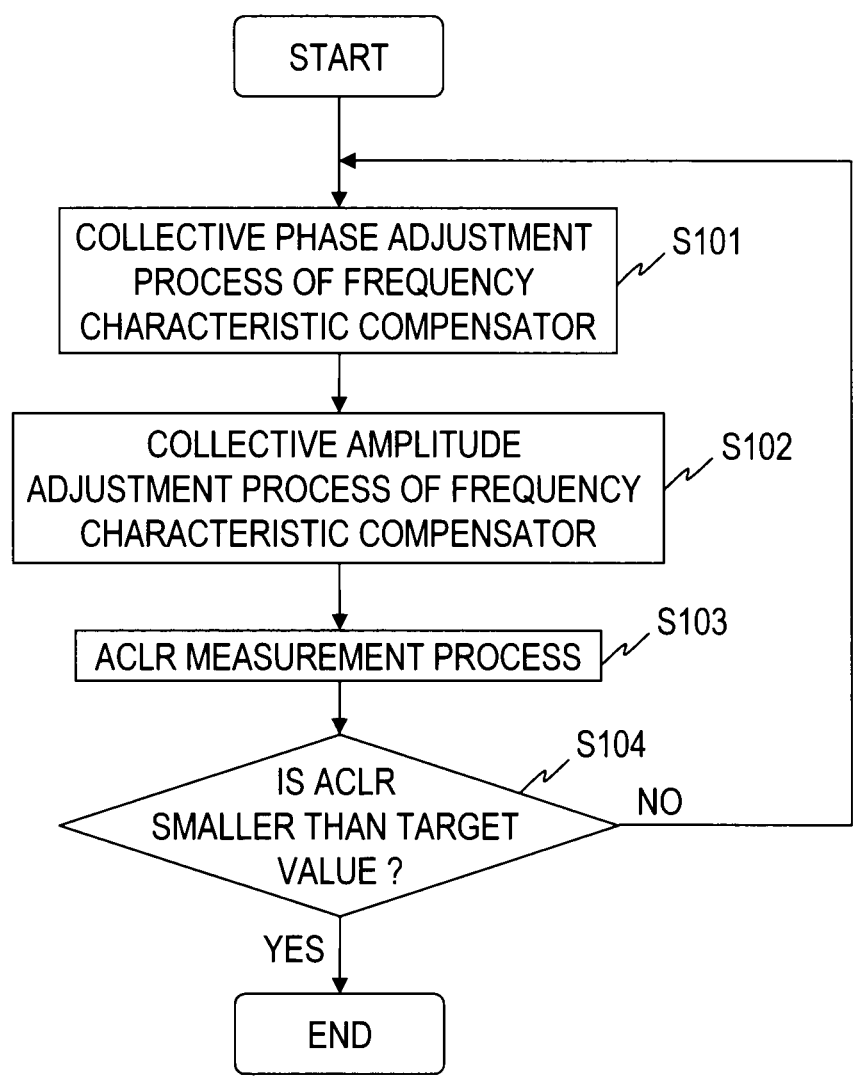
FIG. 7 is a flowchart of processing in the first embodiment.
Figure 8:
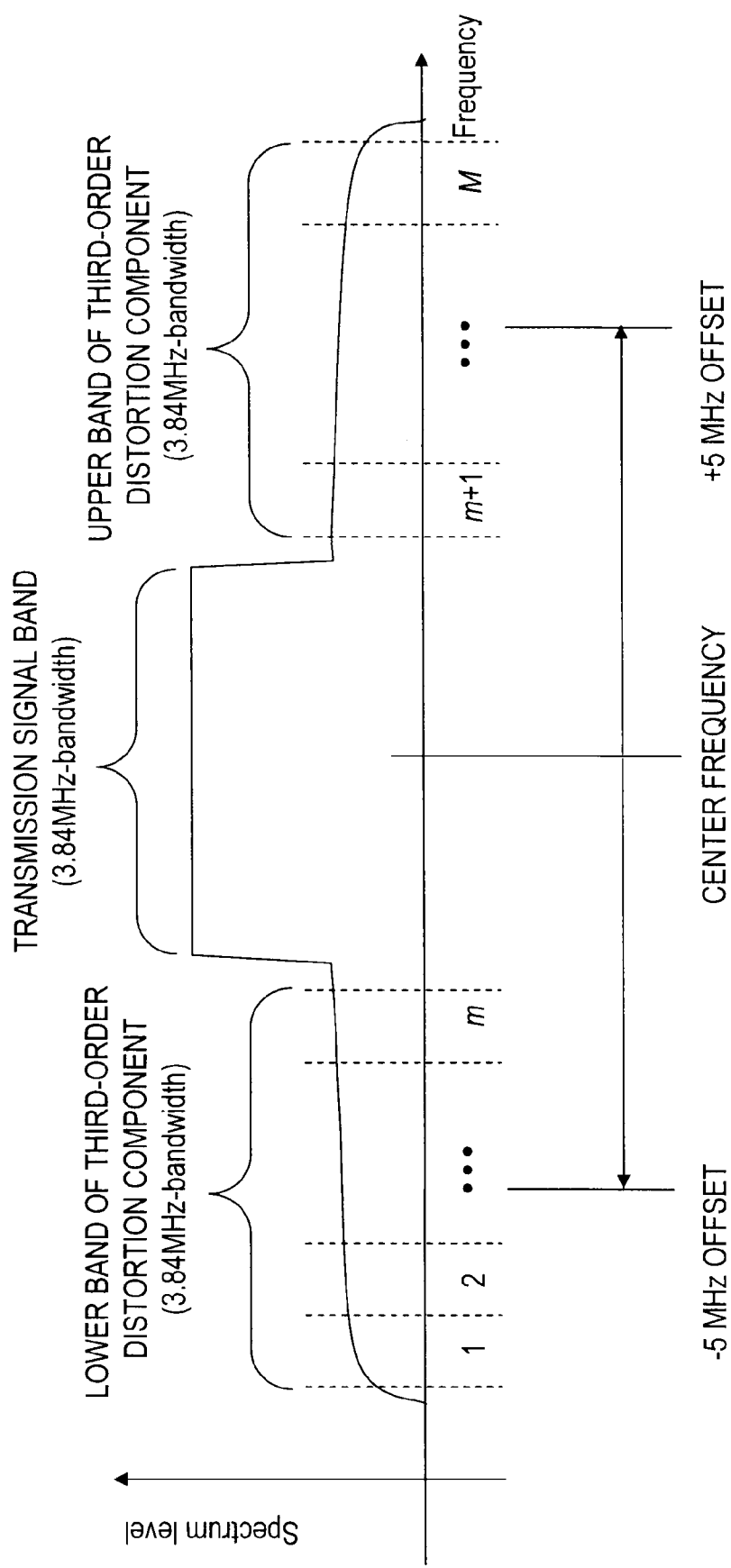
FIG. 8 is a diagram showing an example case of a transmission signal band and distortion component bands in the first embodiment.

With reference to FIG. 7, the flow of processing performed by the controller 107 to set the phase adjustment amount and the amplitude adjustment amount of each of the M bands in the third-order frequency characteristic compensator 101B3 will be described. An example of using a OFDM signal as the transmission signal will be described next. The OFDM signal comprises 64 subcarriers with signal bandwidth of 3.84 MHz, and a route roll off rate of 0.22. The modulation scheme for each subcarrier is QPSK. The bandwidth, route roll off rate, the number of subcarriers, subcarrier modulation scheme, and the like can be specified as needed. The transmission signal can be specified appropriately for the signal to be amplified by the amplifier 950 and can be the WCDMA signal, for example. The adjacent channel leakage power ratio (ACLR) is used as an index for judging the degree of distortion compensation (index indicating the degree of cancellation of the distortion component generated by the power amplifier). As shown in FIG. 8, the ACLR here is the ratio of the power in the upper and lower bands of third-order distortion component (3.84 MHz-bandwidth) at ±5 MHz offset from the center frequency to the power in the transmission signal band (3.84 MHz-bandwidth). The offset from the center frequency and the third-order distortion component band can be specified appropriately for the bandwidth of the transmission signal. The distortion compensation judgment index used in the first embodiment is ACLR, and the upper or lower band of third-order distortion component can also be used as the index.

The phase adjustment amount and amplitude adjustment amount of the third-order distortion vector adjuster 101B2 are considered to have been specified appropriately by a known method. If the power of the third-order distortion component band is used as an index, for example, the controller 107 sets a phase adjustment amount and amplitude adjustment amount in the third-order distortion vector adjuster 101B2 such that the power of the upper or lower band of third-order distortion component is minimized (reaches the target value). One method for determining the phase adjustment amount and amplitude adjustment amount is a perturbation method (see Toshio Nojima, Yoshiharu Okamoto, Satoshi Oyama, "Pre-distortion Nonlinear Compensator for Microwave SSB-AM System", IEICE Transactions, Vol. J67-B, No. 1, January 1984). When the phase adjustment amount is determined by using the perturbation method, the power of the third-order distortion component band is measured when the phase adjustment amount is set to those immediately larger and smaller than the phase adjustment amount set first; the phase adjustment amount is changed by an offset value in the direction in which the power of the third-order distortion component band decreases; and the power of the third-order distortion component band is measured. By changing the phase adjustment amount and measuring the power of the third-order distortion component band repeatedly, the phase adjustment amount that minimizes the power of the third-order distortion component band is obtained. The same process can be applied to the amplitude. Although the controller 107 has a functional element to set the phase adjustment amount and amplitude adjustment amount in the third-order distortion vector adjuster 101B2, the process of setting the phase adjustment amount and amplitude adjustment amount in the third-order distortion vector adjuster 101B2 is carried out prior to and independently of the process of setting a phase adjustment amount and an amplitude adjustment amount in the third-order frequency characteristic compensator 101B3. Therefore, the functional element is not shown in the figure.

Process for Controlling Phase Adjustment Amount and Amplitude Adjustment Amount

The phase setting unit 1071 of the controller 107 sets the phase adjustment amounts of the M distortion component bands collectively in the third-order frequency characteristic compensator 101B3 (collective phase adjustment process in step S101). The amplitude setting unit 1072 of the controller 107 sets the amplitude adjustments of the M distortion component bands collectively in the third-order frequency characteristic compensator 101B3 (collective amplitude adjustment process in step S102). The distortion observer 106 measures the power in the transmission signal band and the power in the M distortion component bands and obtains an ACLR (ACLR measurement process in step S103). The processing control unit 1073 of the controller 107 repeats steps S101 to S103 until the measured ACLR falls below the target value (ACLR judgment process in step S104). Here, the phase adjustment amounts of the M distortion component bands are specified collectively. Then, the amplitude adjustment amounts of the M distortion component bands are specified collectively. This is because the increase or decrease in the distortion component corresponding to the change in phase is generally larger than the increase or decrease in the distortion component corresponding to the change in amplitude. Some power amplifiers 953, however, have a larger increase or decrease in the distortion component corresponding to the change in amplitude than the increase or decrease in the distortion component corresponding to the change in phase. In that case, it is preferable to specify the amplitude adjustment amounts of the M distortion component bands collectively and then specify the phase adjustment amounts of the M distortion component bands collectively.

The collective phase adjustment process of the controller 107 will be described (this process will be referred to as collective phase adjustment process 1). In the description given below, the phase adjustment amount to be specified in each of the M divided bands of the third-order frequency characteristic compensator 101B3 will be denoted by $X_m$ (0<m≤M), and the distortion component power in the divided band will be denoted by $D_m$.

Figure 9:
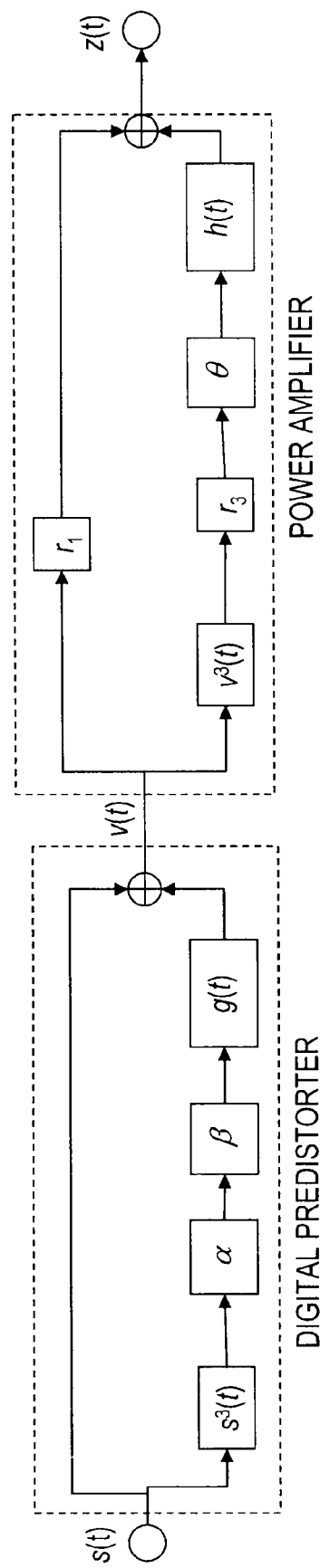
FIG. 9 is a diagram showing an equivalent low-pass system model of the digital predistorter and a power amplifier.

With reference to J. Ohkawara, Y. Suzuki, and S, Narahashi, "Fast Calculation Scheme for Frequency Characteristic Compensator of Digital Predistortion Linearizer," IEEE Vehicular Technology Conference Spring 2009, proceedings, April 2009, the relationship between the distortion component and the phase adjustment amount to be set in the third-order frequency characteristic compensator and the relationship between the distortion component and the amplitude adjustment amount to be set in the third-order frequency characteristic compensator will be described. FIG. 9 shows an equivalent low-pass system model of the digital predistorter and power amplifier. The power amplifier is formed of an amplification path and a third-order distortion generation path. Here, s(t) denotes the input signal of the digital predistorter; α and β respectively denote the amplitude and phase of the third-order distortion vector adjuster in the digital predistorter; g(t) denotes the impulse response of the third-order frequency characteristic compensator in the digital predistorter; $r_1$ denotes the gain of the amplification path in the power amplifier; $r_3$ and θ respectively denote the gain and phase of the third-order distortion generation path in the power amplifier; and h(t) denotes the impulse response indicating the frequency dependence of the third-order distortion component in the power amplifier.

The output signal z(t) of the power amplifier can be expressed as follows.

$$z(t)=r_1(s(t)+\alpha e^{j\beta}g(t)*s^3(t))+r_3 e^{j\theta}h(t)*(s(t)+\alpha e^{j\beta}g(t)*s^3(t))^3 \quad (1)$$

The asterisk (*) indicates convolution.

With respect to just the third-order distortion component in Equation (1), the distortion component e(t) can be expressed as follows.

$$e(t)=r_3 e^{j\theta}h(t)*s^3(t)+r_1\alpha e^{j\beta}g(t)*s^3(t) \quad (2)$$

Equation (2) converted into the frequency domain is as follows.

$$E(f)=(r_3 e^{j\theta}H(f)+r_1\alpha e^{j\beta}G(f))S_3(f) \quad (3)$$

Here, E(f), H(f), G(f), and $S_3(f)$ are L-point discrete Fourier transforms of e(t), h(t), $g_3(t)$, and $s^3(t)$, respectively. The frequency characteristic $H_m$ of the distortion component in the divided band m of the third-order frequency characteristic compensator is expressed as follows.

$$H_m=K_m e^{j\phi_m} \quad (4)$$

The third-order frequency characteristic compensator coefficient $G_m$ is expressed as given below.

$$G_m = Y_m e^{jX_m} \quad (5)$$

Here, $Y_m$ is the amplitude adjustment amount in the divided band m of the third-order frequency characteristic compensator. From Equations (3) to (5), the power $D_m$ of the distortion component in the divided band m is expressed as follows.

$$D_m = \quad (6)$$
$$\frac{|E_m|^2}{|S_{3,m}|^2} = |(r_3 K_m)^2 + 2r_1 r_3 \alpha K_m Y_m \cos(\theta + \phi_m - \beta - X_m) + (r_1 \alpha Y_m)^2|$$

Equation (6) indicates that if $Y_m$ is a constant $Y_m(0)$, $D_m$ is minimized when $\cos(\theta + \phi_m - \beta - X_m) = -1$. Therefore, by the Taylor expansion around $X_m = \theta + \phi_m - \beta - \pi$, the relationship between $X_m$ and $D_m$ can be approximated by the equation given below:

$$D_m\big|_{Y_m(0)} \cong \left| \begin{array}{c} r_1 r_3 \alpha K_m Y_m(0) X_m^2 - 2r_1 r_3 \alpha K_m Y_m(0) \\ (\theta + \phi_m - \beta - \pi) X_m + (r_3 K_m)^2 + (r_1 \alpha Y_m(0))^2 + \\ 2r_1 r_3 \alpha K_m Y_m(0)\left(-1 + \frac{(\theta + \phi_m - \beta - \pi)^2}{2}\right) \end{array} \right| \quad (7)$$

$$= |a_{2,m} X_m^2 + a_{1,m} X_m + a_{0,m}|$$

where $a_{2,m} = r_1 r_3 \alpha K_m Y_m(0)$
$a_{1,m} = -2r_1 r_3 \alpha K_m Y_m(0)(\theta + \phi_m - \beta - \pi)$
$a_{0,m} = (r_3 K_m)^2 + (r_1 \alpha Y_m(0))^2 +$
$\quad 2r_1 r_3 \alpha K_m Y_m(0)\left(-1 + \frac{(\theta + \phi_m - \beta - \pi)^2}{2}\right)$ From Equation (7), $D_m$ can be expressed by a quadratic function using $X_m$. When the coefficients ($a_{2,m}$, $a_{1,m}$, $a_{0,m}$) of the quadratic function are obtained, $X_{min,m}$ that minimizes the distortion component can be calculated. The amplitude will be described next. From Equation (7), the relationship between $Y_m$ and $D_m$ when $X_m$ is a constant $X_m(0)$ can be expressed as given below:

$$D_m\big|_{X_m(0)} = \left| \begin{array}{c} (r_1 \alpha)^2 Y_m^2 + 2r_1 r_3 \alpha K_m Y_m \cos \\ (\theta + \phi_m - \beta - X_m(0)) + (r_3 K_m)^2 \end{array} \right| \quad (8)$$

$$= |b_{2,m} Y_m^2 + b_{1,m} Y_m + b_{0,m}|$$

where $b_{2,m} = (r_1 \alpha)^2$
$b_{1,m} = 2r_1 r_3 \alpha K_m \cos(\theta + \phi_m - \beta - X_m(0))$
$b_{0,m} = (r_3 K_m)^2$ From Equation (8), $D_m$ can be expressed by a quadratic function using $Y_m$. Like $X_m$, $Y_{min,m}$ that minimizes the distortion component can be calculated if the coefficients ($b_{2,m}$, $b_{1,m}$, $b_{0,m}$) of the quadratic function are obtained.

Collective Phase Adjustment Process 1

Figure 10:
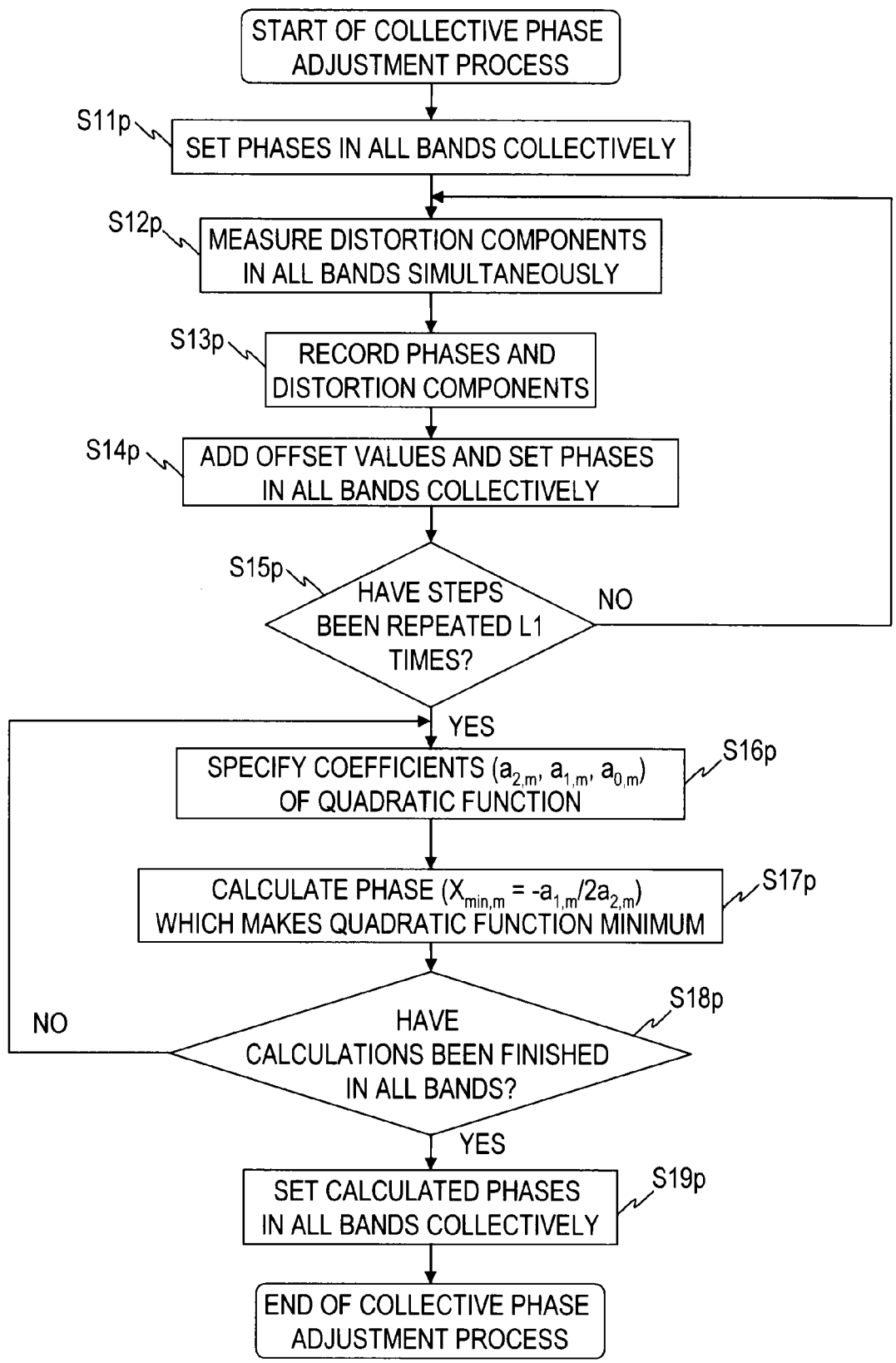
FIG. 10 is a flowchart of a collective phase adjustment process 1 in the first embodiment.

FIG. 10 shows a flowchart illustrating the collective phase adjustment process 1. The phase setting unit 1071 of the controller 107 sets initial phase adjustment amounts $X_1$ to $X_M$ collectively in the third-order frequency characteristic compensator 101B3 (phase step S11p). The distortion observer 106 measures the powers $D_1$ to $D_M$ of the distortion component bands simultaneously (phase step S12p).

The method of measuring the power of the distortion component will be described next. The output signal of the amplifier 950 is converted to analog I/Q signals by the feedback signal generator 960, and the analog I/Q signals are converted to digital I/Q signals by the ADCs 105. The distortion observer 106 converts the digital I/Q signals from serial to parallel, then multiplies them by a window function (such as the Hamming window), and performs the discrete Fourier transform. Because the spectrum of the distortion component can be obtained collectively from the result of the discrete Fourier transform, the distortion observer 106 measures the powers $D_1$ to $D_M$ of the distortion component collectively from the results of the discrete Fourier transform. The conventional distortion observer 906 observes the power of a specified band only. The distortion observer 106 in the first embodiment measures the powers $D_1$ to $D_M$ of the M distortion component bands collectively.

The phase setting unit 1071 of the controller 107 records the set phase adjustment amount $X_m$ and the measured power $D_m$ as $R1_{m,l1}$ and $R2_{m,l1}$ (0<l1≤L1) in each band (phase step S13p). The phase setting unit 1071 of the controller 107 adds predetermined offset values $A1_1$ to $A1_M$ (positive values) to the phase adjustment amounts $X_1$ to $X_M$ and sets the new phase adjustment amounts $X_1$ to $X_M$ collectively in the third-order frequency characteristic compensator 101B3 (phase step S14p). The phase setting unit 1071 of the controller 107 repeats the phase steps S12p to S14p L1 times (L1 is an integer equal to or larger than 3) (phase step S15p). In the phase step S14p, negative offset values may be added to the phase adjustment amounts. Instead of adding or subtracting positive offset values to or from the phase adjustment amounts in all the distortion component bands, there may be bands in which a positive offset value is added to the phase adjustment amount and bands in which a negative offset value is added to the phase adjustment amount. For example, a positive offset value may be added to the phase adjustment amount in odd-numbered distortion compensation bands, and a negative offset value may be added to the phase adjustment amount in even-numbered distortion compensation bands. The process may be modified such that, if the judgment made in the phase step S15p is No, the phase step S14p is executed.

If the phase steps S12p to S14p are executed L1 times, the phase setting unit 1071 of the controller 107 specifies the coefficients ($a_{2,m}$, $a_{1,m}$, $a_{0,m}$) of the quadratic function ($D_m = a_{2,m} X_m^2 + a_{1,m} X_m + a_{0,m}$) representing the relationship between the phase adjustment amount $X_m$ and the distortion component $D_m$, by using $R1_{m,l1}$ and $R2_{m,l1}$, by the least squares method (phase step S16p). Then, the phase setting unit 1071 of the controller 107 calculates the phase adjustment amount $X_{min,m}$ that minimizes the quadratic function, as $-a_{1,m}/(2a_{2,m})$ (phase step S17p). The phase setting unit 1071 of the controller 107 repeats the phase steps S16p and S17p until the phase adjustment amount $X_{min,m}$ is calculated in all the distortion component bands (phase step S18p). After calculating the phase adjustment amount $X_{min,m}$ in all the distortion component bands, the phase setting unit 1071 of the controller 107 sets the phase adjustment amounts $X_{min,m}$ to $X_{min,m}$ collectively in the third-order frequency characteristic compensator 101B3 (phase step S19p).

The relationship between the phase adjustment amount and the distortion component can be represented by a quadratic function by using the Taylor expansion on Equation (7), as descried earlier. The relationship between the phase adjustment amount and the distortion component may be represented by a cosine function ($D_m = c_{2,m} \cos(c_{1,m} - X_m) + c_{0,m}$), without using the Taylor expansion, and the coefficients ($c_{2,m}$, $c_{1,m}$, $c_{0,m}$) may be specified by using the least squares method in the phase step S16$p$, where $$c_{2,m} = 2r_1 r_3 \alpha K_m Y_m(0)$$

$$c_{1,m} = \theta + \phi_m - \beta$$

$$D_m = (r_3 K_m)^2 + (r_1 \alpha Y_m(0))^2$$

In the phase step S17$p$, $X_m$ is calculated so that $D_m$ is minimized with the specified coefficients ($c_{2,m}$, $c_{1,m}$, $c_{0,m}$). For example, if $X_m$ is in radians, $X_{min,m}$ is calculated as $\pi - c_{1,m}$. Since the cosine function is used instead of approximation by the Taylor expansion, the relationship between the phase adjustment amount and the distortion component may be represented more accurately than when the quadratic function is used. The distortion compensation amount obtained by using the cosine function becomes larger than that obtained by using the quadratic function, and it may be possible to reach the target value with a smaller number of repetitions. Instead of the cosine function, a sine function can be used by utilizing the supplementary angle formula. In other embodiments described later, the relationship between the phase adjustment amount and the distortion component may be a cosine function.

Figure 11:
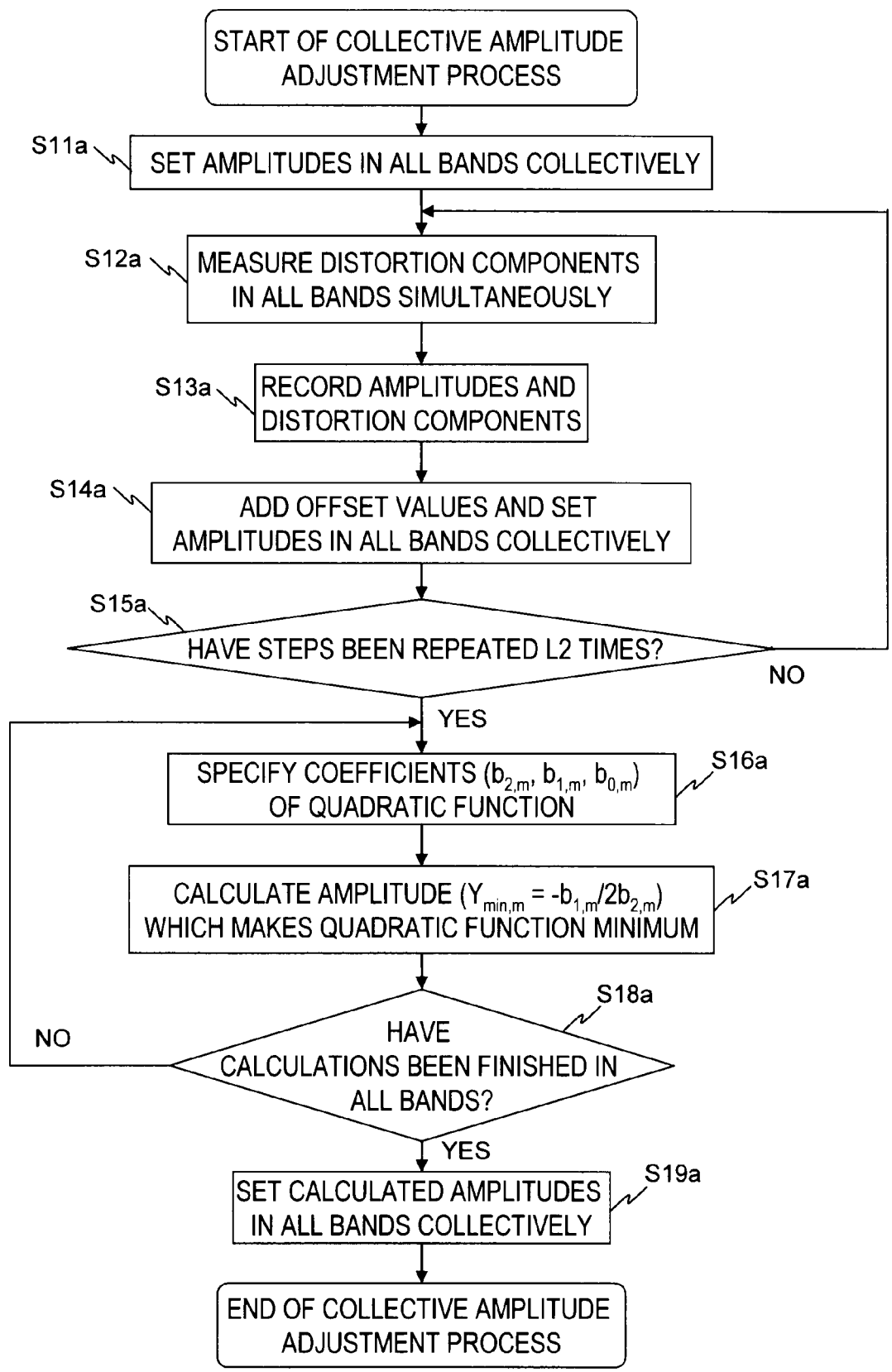
FIG. 11 is a flowchart of a collective amplitude adjustment process 1 in the first embodiment.

The collective amplitude adjustment process in the controller 107 is as illustrated by a flowchart shown in FIG. 11 (this process will be referred to as collective amplitude adjustment process 1). In the following description, the amplitude adjustment amount to be specified in each of the M divided bands of the third-order frequency characteristic compensator 101B3 will be denoted by $Y_m$.

Collective Amplitude Adjustment Process 1

The amplitude setting unit 1072 of the controller 107 sets initial amplitude adjustment amounts $Y_1$ to $Y_M$ collectively in the third-order frequency characteristic compensator 101B3 (amplitude step S11$a$). The distortion observer 106 measures the distortion component powers $D_1$ to $D_M$ simultaneously (amplitude step S12$a$). The amplitude setting unit 1072 of the controller 107 records the set amplitude adjustment amount $Y_m$ and the measured power $D_m$ as R3$_{m,l2}$ and R4$_{m,l2}$ (0<l2≤L2) in each band (amplitude step S13$a$). The amplitude setting unit 1072 of the controller 107 adds predetermined offset values B1$_1$ to B1$_M$ (positive values) to the amplitude adjustment amounts $Y_1$ to $Y_M$ and sets the new amplitude adjustment amounts $Y_1$ to $Y_M$ collectively in the third-order frequency characteristic compensator 101B3 (amplitude step S14$a$). The amplitude setting unit 1072 of the controller 107 repeats the amplitude steps S12$a$ to S14$a$ L2 times (L2 is an integer equal to or larger than 3) (amplitude step S15$a$). In the amplitude step S14$a$, if the amplitude is larger than 0, a negative offset value may be added to the amplitude adjustment amount. Instead of adding or subtracting positive offset values to or from the amplitude adjustment amounts in all the distortion component bands, there may be bands in which a positive offset value is added to the amplitude adjustment amount and bands in which a negative offset value is added to the amplitude adjustment amount. For example, a positive offset value may be added to the amplitude adjustment amount in odd-numbered distortion compensation bands, and a negative offset value may be added to the amplitude adjustment amount in even-numbered distortion compensation bands. The process may be modified such that, if the judgment made in the amplitude step S15$a$ is No, the amplitude step S14$a$ is executed.

If the amplitude steps S12$a$ to S14$a$ are executed L2 times, the amplitude setting unit 1072 of the controller 107 specifies the coefficients ($b_{2,m}$, $b_{0,m}$) of the quadratic function ($D_m = b_{2,m} Y^2_m + b_{1,m} Y_m + b_{0,m}$) representing the relationship between the amplitude adjustment amount $Y_m$ and the distortion component $D_m$, by using R3$_{m,l2}$ and R4$_{m,l2}$, by the least squares method (amplitude step S16$a$). Then, the amplitude setting unit 1072 of the controller 107 calculates the amplitude adjustment amount $Y_{min,m}$ that minimizes the quadratic function, as $-b_{1,m}/(2b_{2,m})$ (amplitude step S17$a$). The amplitude setting unit 1072 of the controller 107 repeats the amplitude steps S16$a$ and S17$a$ until the amplitude adjustment amount $Y_{min,m}$ is calculated in all the distortion component bands (amplitude step S18$a$). After calculating the amplitude adjustment amount $Y_{min,m}$ in all the distortion component bands, the amplitude setting unit 1072 of the controller 107 sets the amplitude adjustment amounts $Y_{min,1}$ to $Y_{min,M}$ collectively in the third-order frequency characteristic compensator 101B3 (amplitude step S19$a$).

Figure 12:
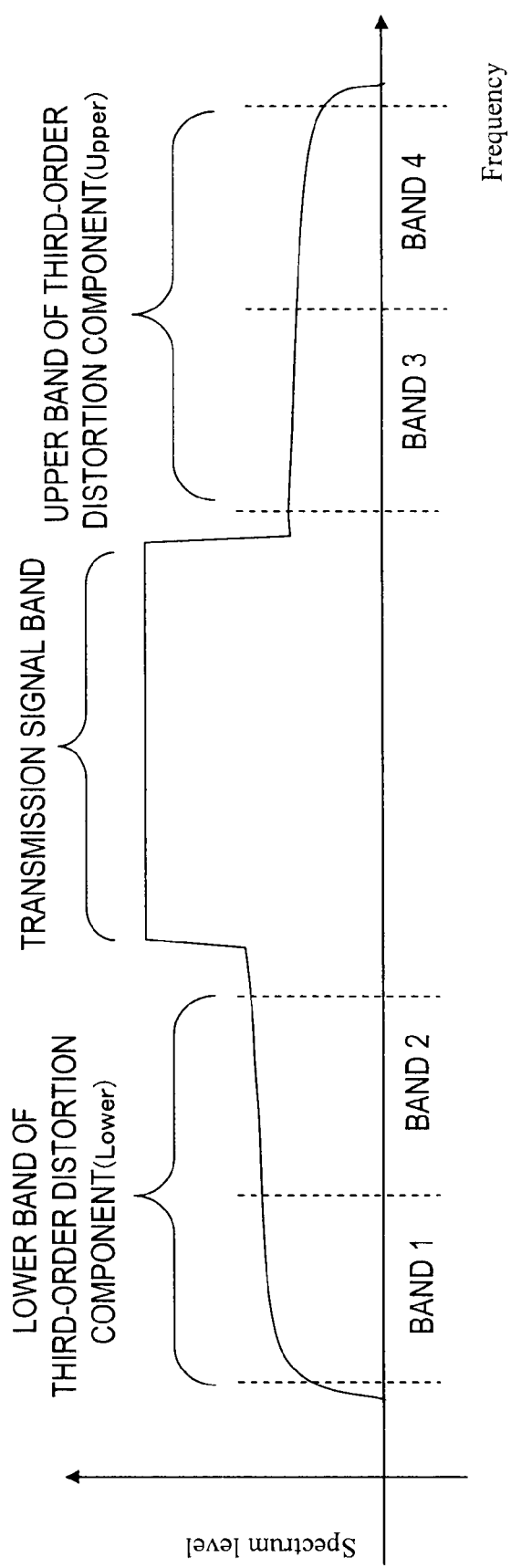
FIG. 12 is a diagram showing an example band division in the frequency characteristic compensator in an experiment employing the first embodiment.

The results of an experiment in the first embodiment will be described next. In the experiment, a 2-GHz 1 W-class amplifier (output backoff 12.4 dB) was used. The upper and lower bands of third-order distortion component were divided into two equal parts (M=4) respectively, and the bands were marked with numbers 1 to 4 from the low frequency side (see FIG. 12). L1 and L2 were both 3. The target ACLR value was −45 dBc in the experiment. A comparative experiment was carried out on the conventional control method (Method A), which adjusts phase and amplitude in one band after another. FIG. 13 shows the time needed to set phases, for example, by the method A and the control method in the first embodiment (method B). In FIG. 13, (1) indicates the processing time for setting the phase adjustment amount and measuring the distortion component; (2) indicates the time needed to calculate the phase adjustment amount that minimizes the quadratic function; and (3) indicates the processing time for setting the calculated phase adjustment amount. The periods (1), (2), and (3) are equally sized in FIG. 13 for the sake of simplicity, but they actually differ in size. As shown in FIG. 13, the processes corresponding to (1) to (3) are executed for one band after another in method A, whereas the processes are executed for all the distortion component bands collectively in method B. The phase adjustment amounts can be determined more quickly by method B than by method A.

Figure 14B:
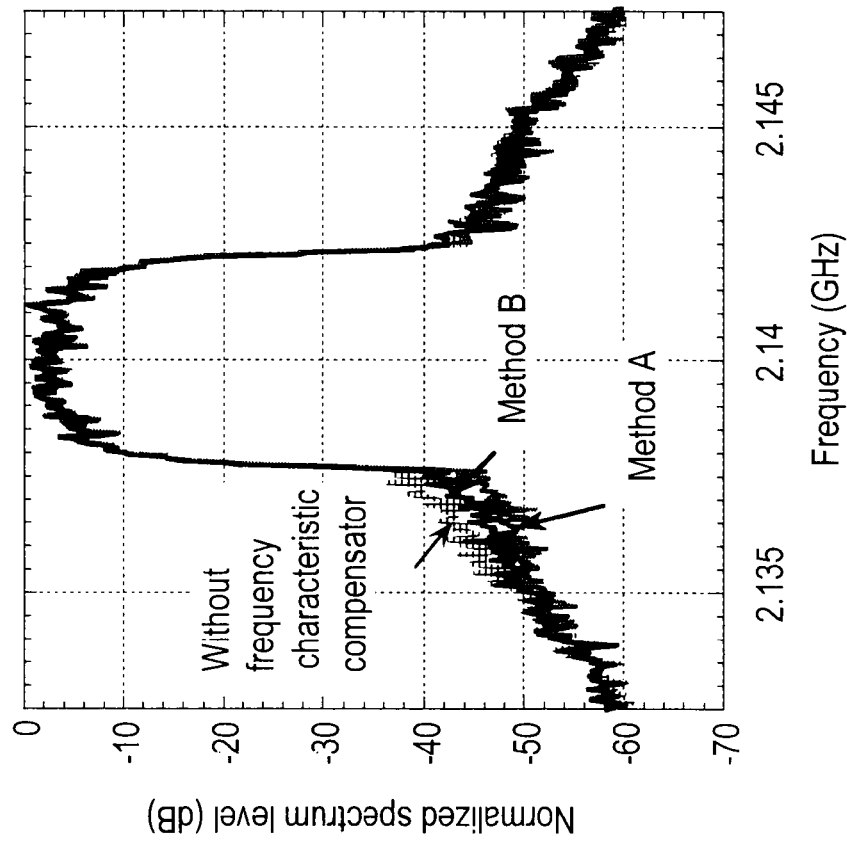
FIG. 14B shows experimental result adjustment periods of time.
Figure 14A:
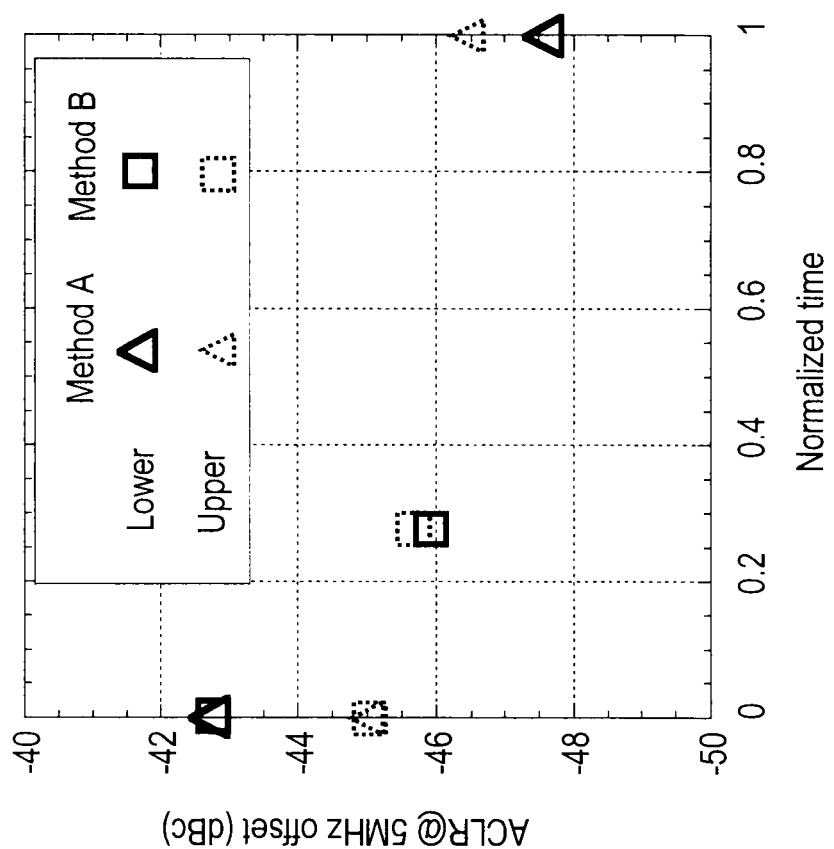
FIG. 14A shows an experimental result spectrum.

FIG. 14A shows a spectrum (marked by "without frequency characteristic compensator") before phase adjustment amounts and amplitude adjustment amounts are set in the third-order frequency characteristic compensator 101B3, a spectrum when method A is used, and a spectrum when method B is used. FIG. 14B shows the upper and lower ACLRs for the normalized time. The setting times in methods A and B were normalized separately on the horizontal axis with reference to the period required to specify the phase adjustment amounts and amplitude adjustment amounts that reduce the distortion component to the minimum level (target level) in all the bands by method A. FIG. 14A shows that the distortion compensation amount in the lower spectrum by method B is smaller than that by method A. FIG. 14B shows that both the upper ACLR and the lower ACLR are below the target value in methods A and B. Here, the normalized time of method B is 0.28, and the normalized time of method A is 1.0. This means that method B reduces the setting time by 72% compared with the conventional control method A.

Figure 15:
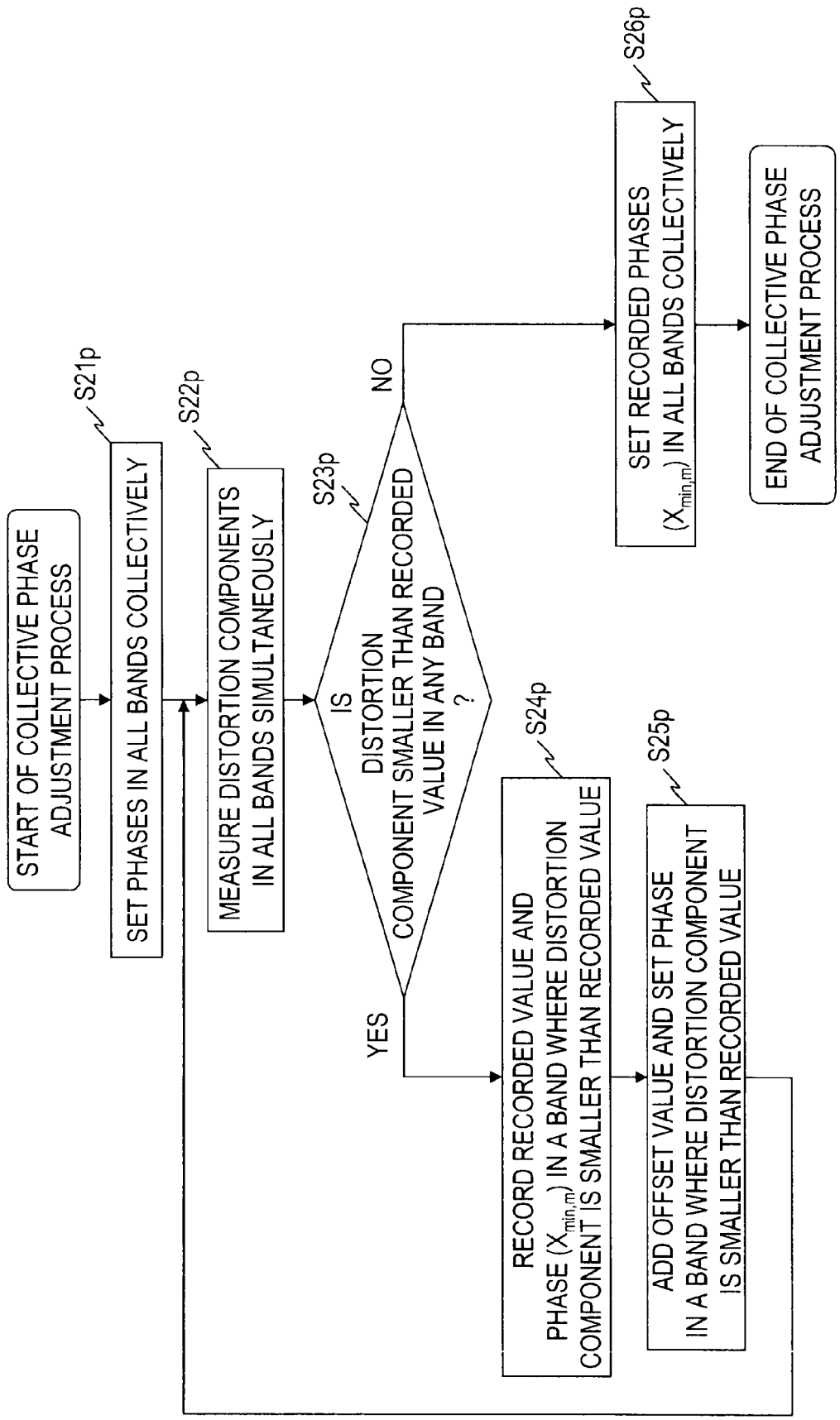
FIG. 15 is a flowchart of a collective phase adjustment process 2 in the first embodiment.

The collective phase adjustment process by the controller 107 may be as illustrated in a flowchart shown in FIG. 15 (this process will be referred to as collective phase adjustment process 2).

Collective Phase Adjustment Process 2

The controller 107 sets initial phase adjustment amounts $X_1$ to $X_M$ collectively in the third-order frequency characteristic compensator 101B3 (phase step S21p). The distortion observer 106 measures the distortion component powers $D_1$ to $D_M$ simultaneously (phase step S22p). The controller 107 compares the distortion component power $D_m$ with a recorded value $R5_m$ in each band (phase step S23p). If the distortion component power becomes smaller than the recorded value in one band at least, the controller 107 records the phase adjustment amount $X_m$ and the distortion component power $D_m$ in the band where the distortion component power $D_m$ is lower than the recorded value $R5_m$ as $X_{min,m}$ and as the recorded value $R5_m$, respectively (phase step S24p). The initial value of the recorded value $R5_m$ is set to a value higher than the highest distortion component power $D_m$ that can be measured. This causes the phase step S24p to be executed at least once in all the bands and the phase adjustment amount $X_{min,m}$ to be recorded in all the bands. The controller 107 adds the offset value $A2_m$ ($A2_m>0$) to the phase adjustment amount $X_m$, sets the new phase adjustment amount in the band where the distortion component power $D_m$ is lower than the recorded value $R5_m$ (phase step S25p), and returns to the phase step S22p. In that step, a negative offset value may be added to the phase adjustment amount. If the distortion component power is equal to or higher than the recorded value in all the bands, the controller 107 sets the recorded phase adjustment amounts $X_{min,1}$ to $X_{min,M}$ collectively in the third-order frequency characteristic compensator 101B3 (phase step S26p).

Figure 16:
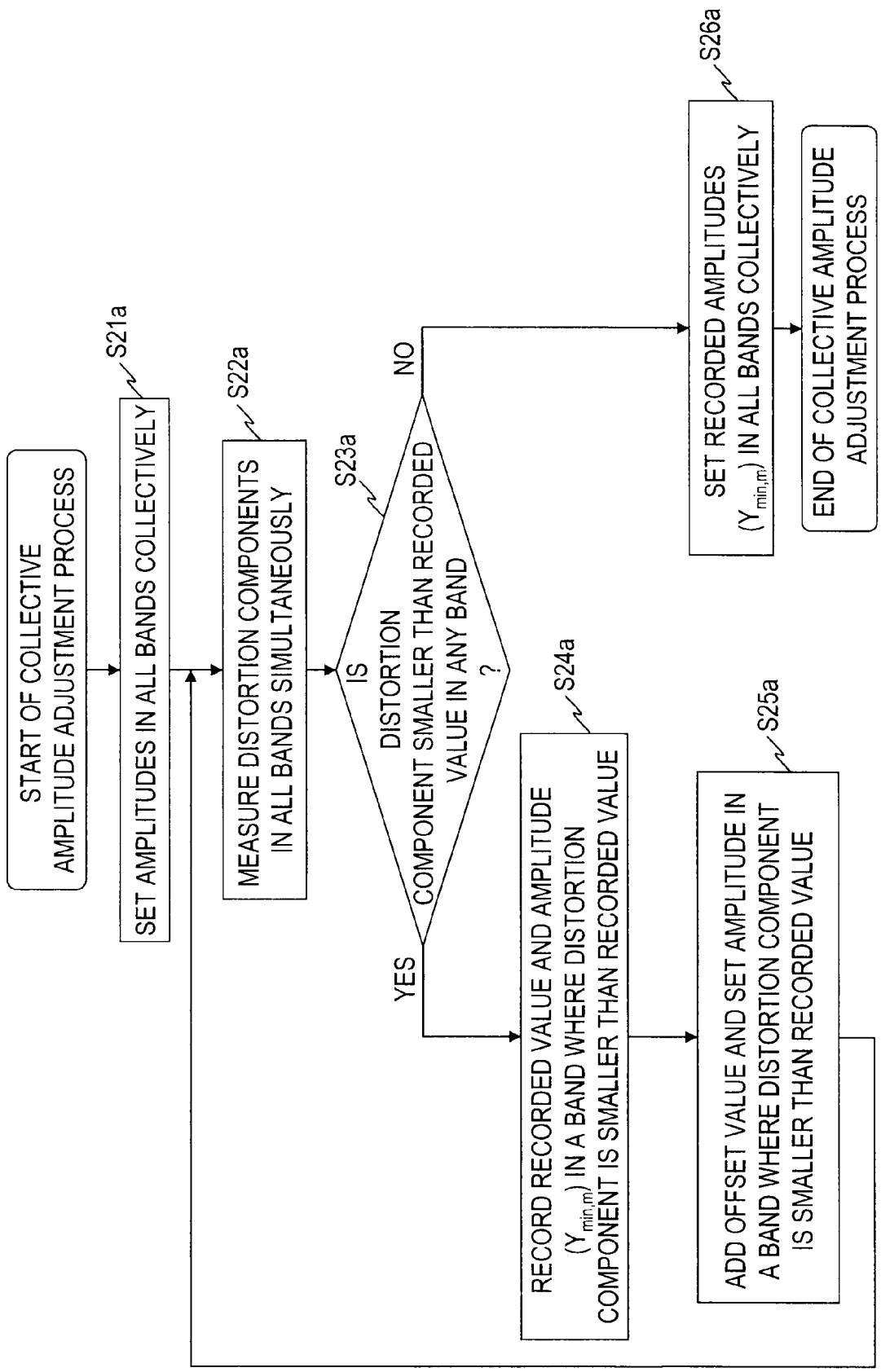
FIG. 16 is a flowchart of a collective amplitude adjustment process 2 in the first embodiment.

The collective amplitude adjustment process by the controller 107 may be as illustrated in a flowchart shown in FIG. 16 (this process will be referred to as collective amplitude adjustment process 2).

Collective Amplitude Adjustment Process 2

The controller 107 sets initial amplitude adjustment amounts $Y_1$ to $Y_M$ collectively in the third-order frequency characteristic compensator 101B3 (amplitude step S21a). The distortion observer 106 measures the distortion component powers $D_1$ to $D_M$ simultaneously (amplitude step S22a). The controller 107 compares the distortion component power $D_m$ with a recorded value $R6_m$ in each band (amplitude step S23a). If the distortion component power is smaller than the recorded value in one band at least, the controller 107 records the amplitude adjustment amount $Y_n$, and the distortion component power $D_m$ in the band where the distortion component power $D_m$ is lower than the recorded value $R6_m$ as $Y_{min,m}$ and recorded value $R6_m$, respectively (amplitude step S24a). The initial value of the recorded value $R6_m$ is set to a value higher than the highest distortion component power $D_m$ that can be measured. This causes the amplitude step S24a to be executed at least once in all the bands and the amplitude adjustment amount $Y_{min,m}$ to be recorded in all the bands. The controller 107 adds the offset value $B2_m$ ($B2_m>0$) to the amplitude adjustment amount $Y_m$, sets the new amplitude adjustment amount in the band where the distortion component power $D_m$ is lower than the recorded value $R6_m$ (amplitude step S25a), and returns to the amplitude step S22a. In that step, if the amplitude adjustment amount $Y_m$ is larger than 0, a negative offset value may be added to the amplitude adjustment amount. If the distortion component power is equal to or higher than the recorded value in all the bands, the controller 107 sets the recorded amplitude adjustment amounts $Y_{min,1}$ to $Y_{min,M}$ collectively in the third-order frequency characteristic compensator 101B3 (amplitude step S26a).

In the first embodiment, after the collective phase adjustment process is repeated, the collective amplitude adjustment process may be repeated, and then the ACLR measurement may be performed. If the collective phase adjustment process 1 and the collective amplitude adjustment process 1 are used, the first phase adjustment amount is specified such that the phase adjustment amount that minimizes the quadratic function becomes the median among the L1 phase adjustment amounts. The offset value may be changed to 2/3 times, 1/2 times, or the like, or may not be changed. The amplitude adjustment amounts are specified in the same manner as the phase adjustment amounts. If the collective phase adjustment process 2 and the collective amplitude adjustment process 2 are used, the phase adjustment amount offset values and the amplitude adjustment amount offset values are changed to 2/3 times, 1/2 times, or the like, respectively.

In the first embodiment, when the collective phase adjustment process 1 is used, the collective amplitude adjustment process 1 is used together therewith, but the collective amplitude adjustment process 2 may be used. When the collective phase adjustment process 2 is used, the collective amplitude adjustment process 2 is used together therewith, but the collective amplitude adjustment process 1 may be used.

If the power of the transmission signal increases or decreases, the distortion component may increase. For that increase, a lookup table may be provided so that the phase adjustment amounts and amplitude adjustment amounts of the third-order frequency characteristic compensator 101B3 can be specified appropriately for the transmission signal power. The lookup table stores the phase adjustment amounts and amplitude adjustment amounts to be set in the third-order frequency characteristic compensator 101B3 on the basis of the transmission signal power. The phase adjustment amounts and amplitude adjustment amounts to be stored are obtained in accordance with the transmission signal power, through the processes described earlier. The distortion observer 106 measures the transmission signal power, and the controller 107 references the lookup table to set phase adjustment amounts and amplitude adjustment amounts suitable for the transmission signal power in the third-order frequency characteristic compensator 101B3.

The processes in the first embodiment do not depend on the order of the distortion in the distortion generation path 101B. If there are a plurality of distortion generation paths 101B, the processes described earlier should be performed in one distortion generation path 101B after another. If there are a third-order distortion generation path and a fifth-order distortion generation path and if a third-order distortion vector adjuster and a fifth-order distortion vector adjuster are controlled appropriately, for example, the phase adjustment amounts and amplitude adjustment amounts of all the bands to be set in the third-order frequency characteristic compensator should be adjusted in the processes described earlier, and the phase adjustment amounts and amplitude adjustment amounts of all the bands to be set in the fifth-order frequency characteristic compensator should be adjusted in the same way. The adjustment for the fifth-order frequency characteristic compensator may be followed by the adjustment for the third-order frequency characteristic compensator.

Second Embodiment

Figure 17:
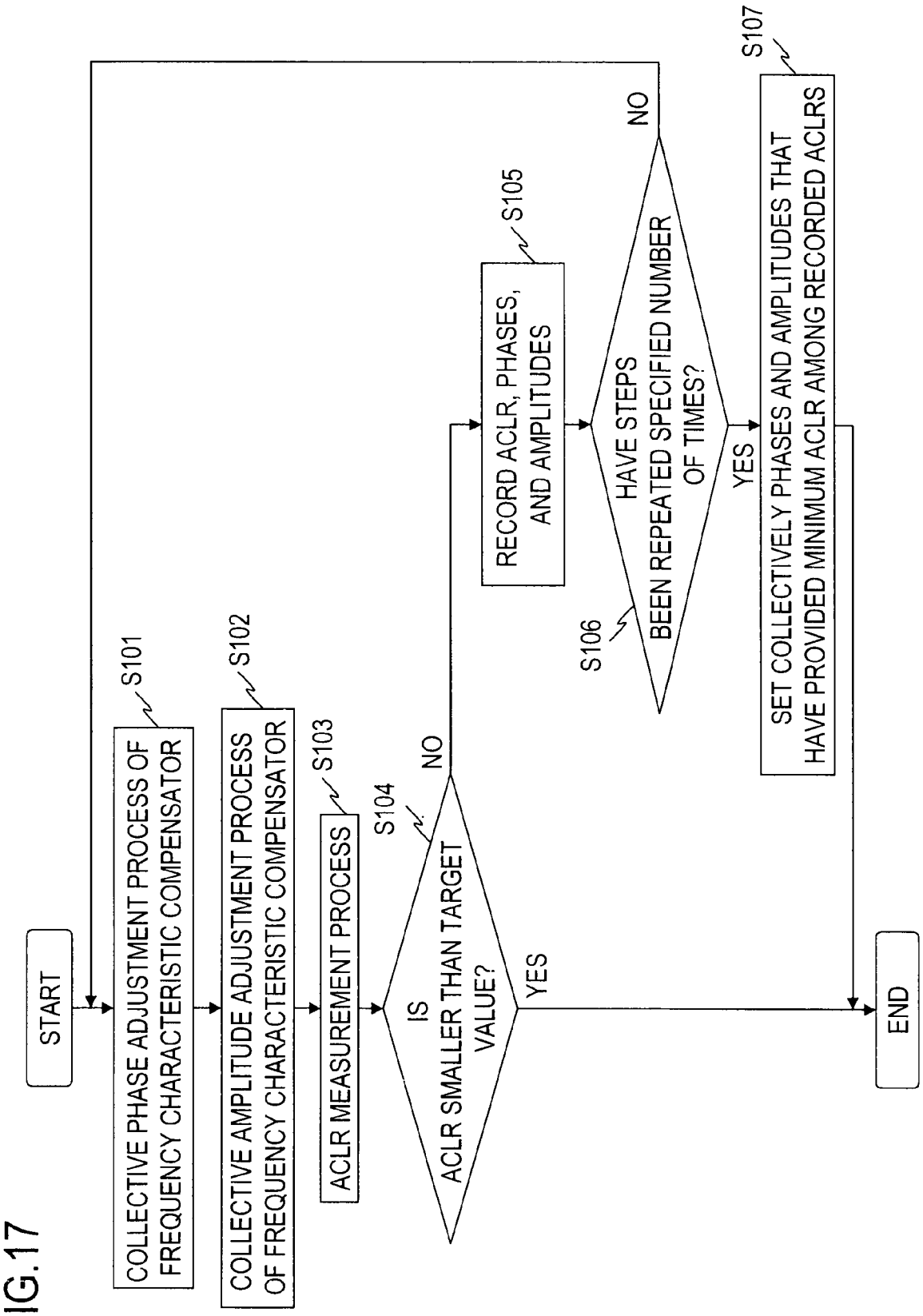
FIG. 17 is a flowchart of processing in a second embodiment.

FIG. 17 shows a flowchart illustrating processing in a second embodiment of the present invention. In the second embodiment, the following processes are added at the transition from the ACLR judgment process to the collective phase adjustment process, in the first embodiment: a process for recording the measured ACLR and the phase adjustment amounts and amplitude adjustment amounts set in the third-order frequency characteristic compensator 101B3 (ACLR, phase, and amplitude recording process in step S105) and a process for determining whether processes (collective phase adjustment process, collective amplitude adjustment process, and ACLR measurement process) have been repeated a specified number of times (first repetition judgment process in step S106). If the processes (collective phase adjustment process, collective amplitude adjustment process, and ACLR measurement process) have not been repeated the specified number of times, the controller 107 proceeds to the collective phase adjustment process described in the first embodiment. If the processes (collective phase adjustment process, collective amplitude adjustment process, and ACLR measurement process) have been repeated the specified number of times, the controller 107 collectively sets the phase adjustment amounts and amplitude adjustment amounts that have provided the minimum ACLRs of the ACLRs recorded in the ACLR, phase, and amplitude recording process, in all the bands of the third-order frequency characteristic compensator 101B3 (S107).

According to the second embodiment, even if the ACLR does not fall below the target value, the phase adjustment amounts and amplitude adjustment amounts that provide the smallest ACLRs among the ACLRs obtained in the processes repeated the specified number of times can be set in the third-order frequency characteristic compensator 101B3 without generating an endless loop.

In the second embodiment, ACLRs are recorded. If the index of the distortion compensation amount in the third-order frequency characteristic compensator 101B3 is the power of the distortion component, the distortion component power is recorded instead of the ACLR in the ACLR, phase, and amplitude recording process (S105). In that case, the controller 107 collectively sets the phase adjustment amounts and amplitude adjustment amounts corresponding to the smallest distortion component powers among the recorded distortion component powers, in all the bands of the third-order frequency characteristic compensator 101B3.

According to the present invention, since the phases and amplitudes in all the distortion component bands are set collectively in the frequency characteristic compensator, the frequency characteristic compensator coefficients (phase and amplitude) can be adjusted quickly, as clearly indicated by the first embodiment.

Third Embodiment

Figure 18:
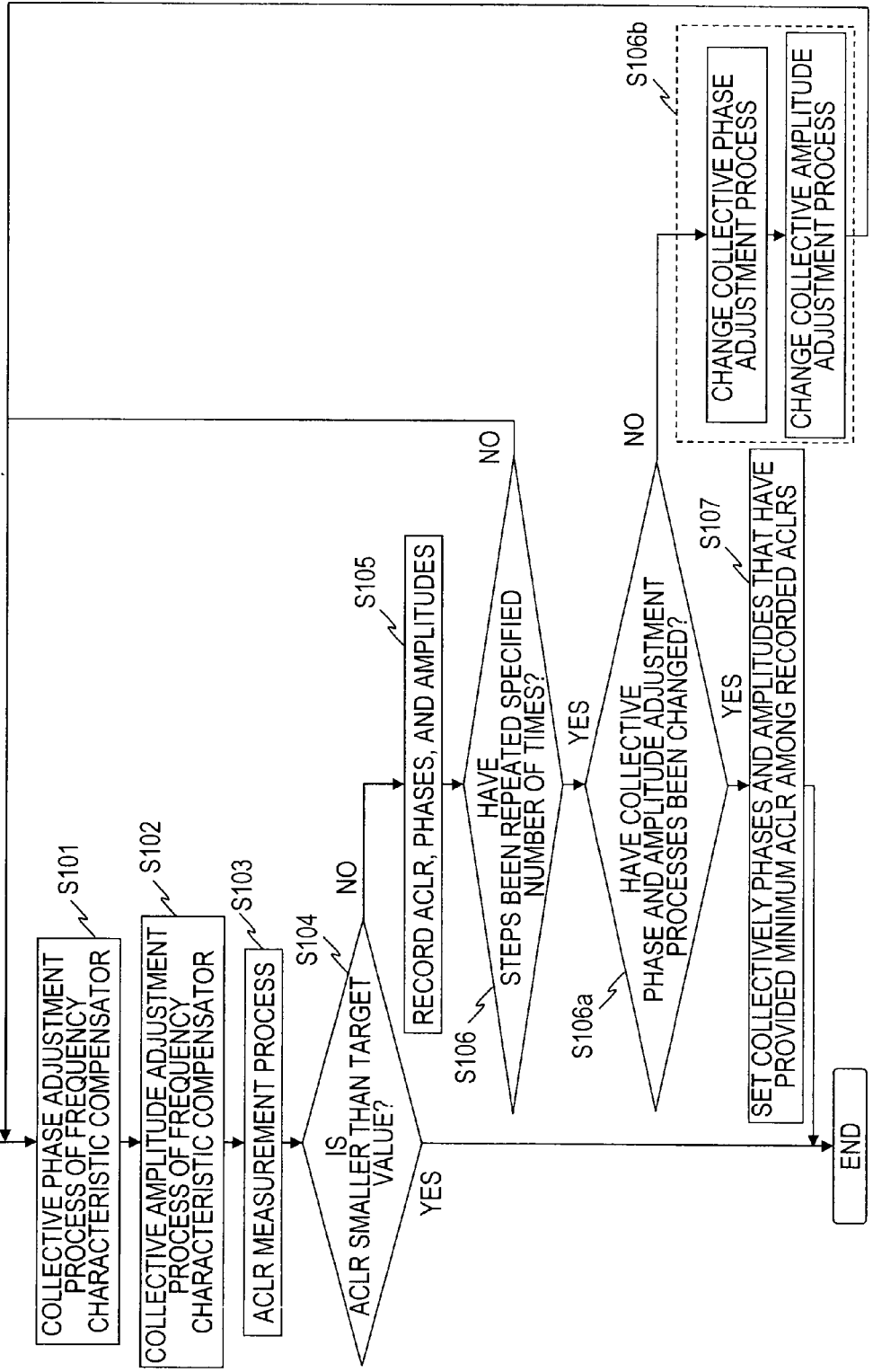
FIG. 18 is a flowchart of processing in a third embodiment.

In a third embodiment described below, since the adjustment time can be reduced more than before, processes for high-precision distortion compensation are carried out. FIG. 18 shows a flowchart of processing in the third embodiment of the present invention. The third embodiment differs from the second embodiment in that, when it is judged in the first repetition judgment process S106 that the processes have been repeated the specified number of times, it is judged whether the collective phase adjustment process and the collective amplitude adjustment process have been modified once (modification judgment process in step S106a). If no modification has been made, the collective phase adjustment process and the collective amplitude adjustment process are modified together (process for modifying the collective phase adjustment process and the collective amplitude adjustment process in step S106b). If processing in the second embodiment is performed in a first stage in accordance with the collective phase adjustment process 1 and the collective amplitude adjustment process 1 described in the first embodiment, processing in the next stage of the second embodiment is performed in accordance with the collective phase adjustment process 2 and the collective amplitude adjustment process 2 described in the first embodiment. Using two different pairs of the collective phase adjustment process and the collective amplitude adjustment process can provide better distortion compensation than using a single pair of the collective phase adjustment process and the collective amplitude adjustment process.

For a case in which the ACLR does not fall below the target value just by changing the collective phase adjustment process and the collective amplitude adjustment process once each or for distortion compensation with higher precision, three or more different pairs of the collective phase adjustment process and the collective amplitude adjustment process may be prepared.

The collective phase adjustment process and the collective amplitude adjustment process need not be changed together; just one process may be changed. For example, in the first stage, processing in the second embodiment is performed in accordance with the collective phase adjustment process 1 and collective amplitude adjustment process 1 described in the first embodiment; in the second stage, processing in the second embodiment is performed in accordance with the collective phase adjustment process 1 and collective amplitude adjustment process 2 described in the first embodiment; in the third stage, processing in the second embodiment is performed in accordance with the collective phase adjustment process 2 and collective amplitude adjustment process 1 described in the first embodiment; and in the final stage, processing in the second embodiment is performed in accordance with the collective phase adjustment process 2 and collective amplitude adjustment process 2 described in the first embodiment.

Fourth Embodiment

Figure 19:
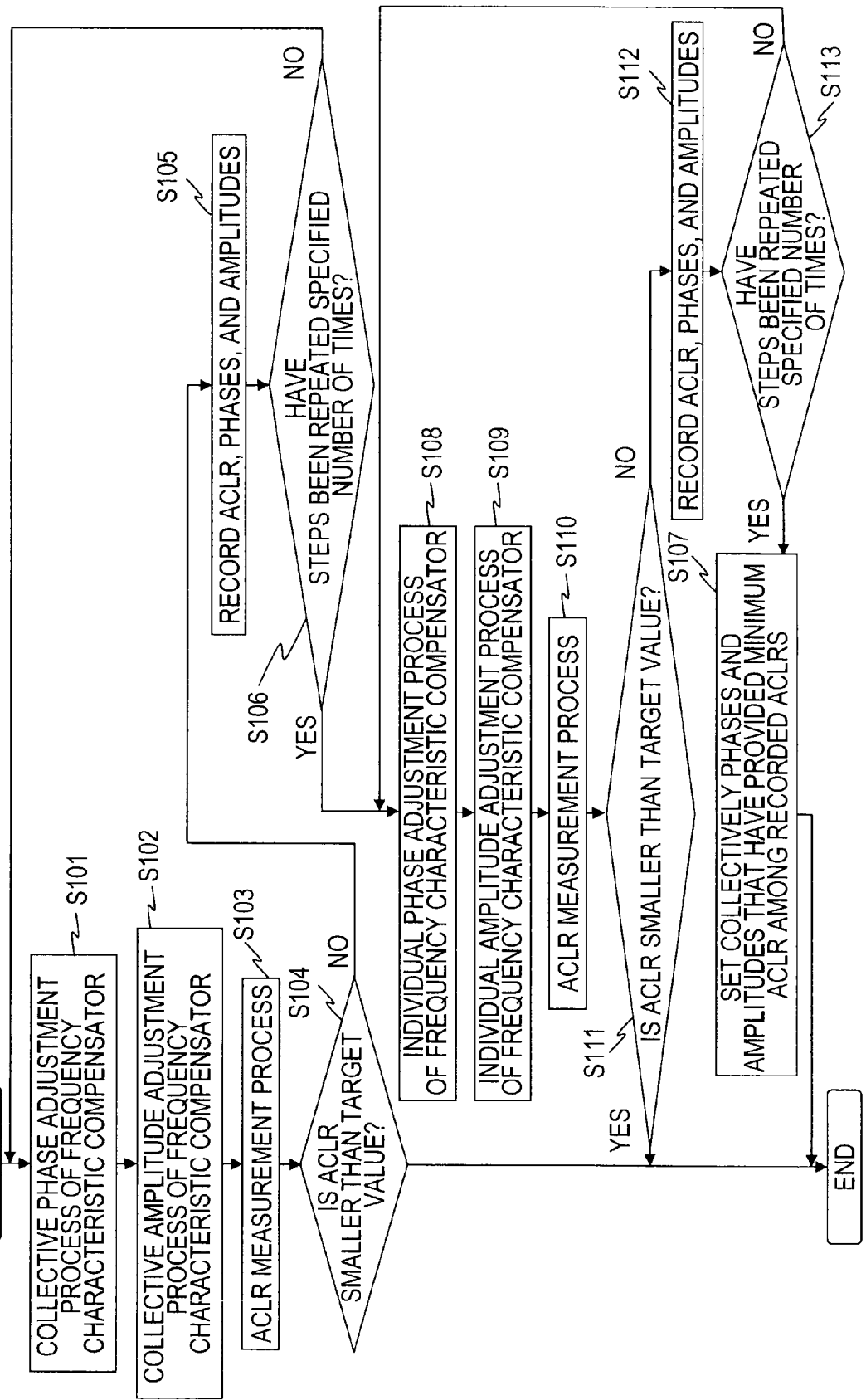
FIG. 19 is a flowchart of processing in a fourth embodiment.

A fourth embodiment differs from the second embodiment in that the phase adjustment amounts and amplitude adjustment amounts are set individually if ACLR does not fall below the target value even after the processes (collective phase adjustment process, collective amplitude adjustment process, and ACLR measurement process) are repeated the specified number of times. FIG. 19 shows a flowchart illustrating processing in the fourth embodiment. The difference from the second embodiment is that, if it is judged in the first repetition judgment process in step S106 shown in FIG. 19 that the processes (collective phase adjustment process, collective amplitude adjustment process, and ACLR measurement process) have been repeated the specified number of times, the phase adjustment amount is adjusted in one band after another (individual phase adjustment process in step S108); the amplitude adjustment amount is adjusted in one band after another (individual amplitude adjustment process in step S109); the ACLR measurement process in step (S110) is carried out; and except when the ACLR falls below the target value (S111), the individual phase adjustment process to the ACLR measurement process (S108 to S110) are repeated in that order up to a specified number of times (second repetition judgment process in step S113). Prior to the second repetition judgment process in step S113, an ACLR, phase, and amplitude recording step S112, which is the same as the ACLR, phase, and amplitude recording step S105 described in the second embodiment, is performed. If the ACLR does not fall below the target value after the individual phase adjustment process S108 to the ACLR measurement process S110 are repeated, the controller 107 collectively sets the phase adjustment amounts and amplitude adjustment amounts corresponding to the minimum ACLRs among the measured ACLRs in the third-order frequency characteristic compensator 101B3. The repetition count judged in the second repetition judgment process in step S113 may or may not be the same as the repetition count judged in the first repetition judgment process in step S106.

In the fourth embodiment, after the phase adjustment amounts are adjusted, the amplitude adjustment amounts are adjusted. This is because the increase or decrease in the distortion component corresponding to the change in phase is generally larger than the increase or decrease in the distortion component corresponding to the change in amplitude. In some power amplifiers 953, however, the increase or decrease in the distortion component corresponding to the change in amplitude is larger than the increase or decrease in the distortion component corresponding to the change in phase. In that case, the phase adjustment and amplitude adjustment may be performed in reverse order.

Figure 20:
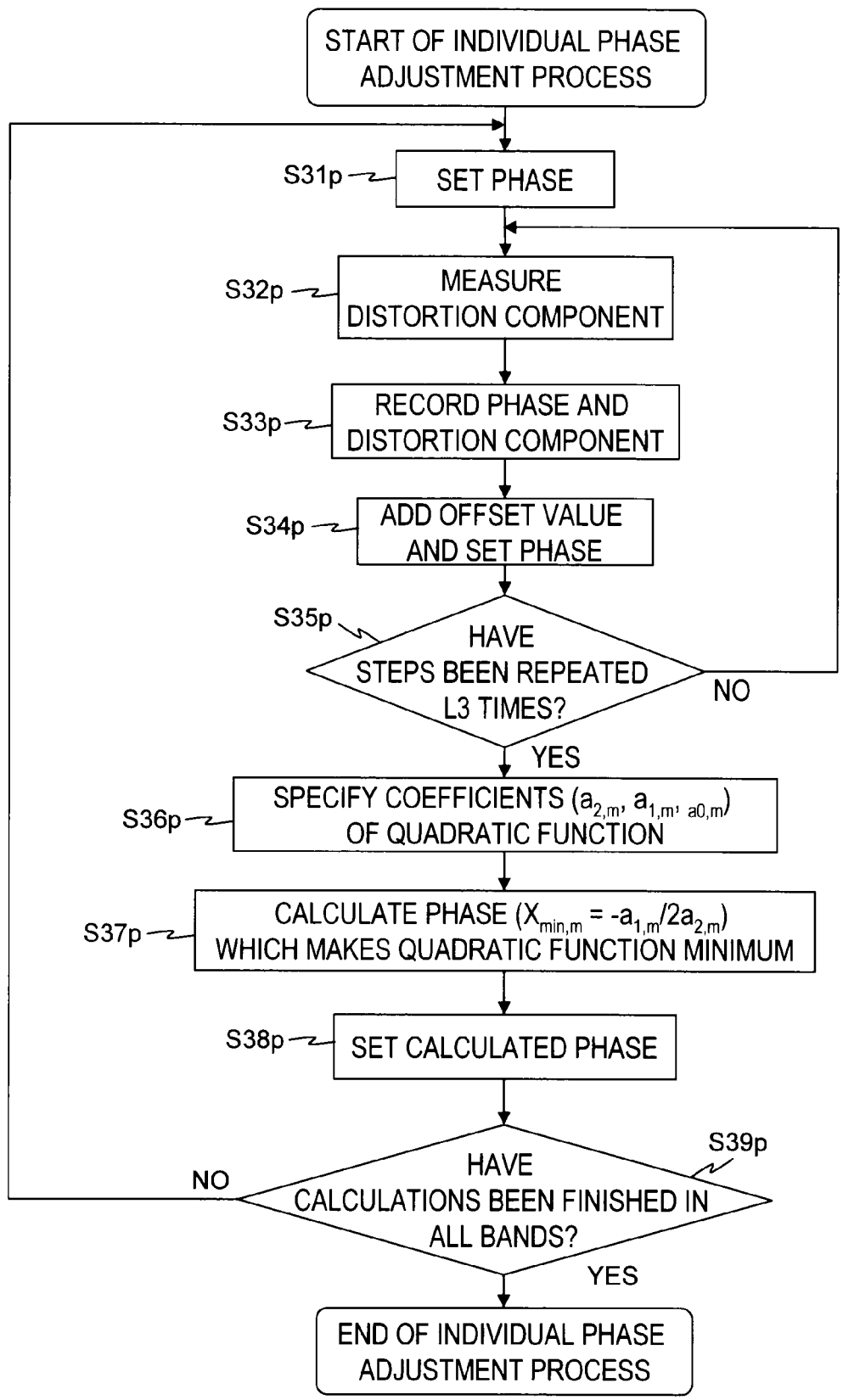
FIG. 20 is a flowchart of an individual phase adjustment process 1 in the fourth embodiment.

The individual phase adjustment process will be described next with reference to FIG. 20 (this process will be referred to as individual phase adjustment process 1).

Individual Phase Adjustment Process 1

The controller 107 sets the phase adjustment amount $X_m$ in the band m (phase step S31p). The distortion observer 106 measures the distortion component power $D_m$ in the band m (phase step S32p). The controller 107 records the set phase adjustment amount $X_m$ and the measured power $D_m$ as $R7_{m,l3}$ and $R8_{m,l3}$ ($0 < l3 \leq L3$), respectively (phase step S33p). The controller 107 adds an offset value $A3_m$ ($A3_m > 0$) to the phase adjustment amount $X_m$ and sets the new phase adjustment amount $X_m$ in the band m (phase step S34p). The controller 107 repeats the phase steps S32p to S34p L3 times (L3 is an integer equal to or larger than 3) (phase step S35p). In the phase step S34p, a negative offset value may be added to the phase adjustment amount. When the phase steps S32p to S34p are executed L3 times, the controller 107 specifies the coefficients ($a_{2,m}$, $a_{1,m}$, $a_{0,m}$) of a quadratic function ($D_m = a_{2,m} X^2_m + a_{1,m} X_m + a_{0,m}$) representing the relationship between the phase adjustment amount $X_m$ and the distortion component $D_m$, by using $R7_{m,l3}$ and $R8_{m,l3}$, by the least squares method (phase step S36p). The controller 107 calculates the phase adjustment amount $X_{min,m}$ that minimizes the quadratic function, as $-a_{1,m}/(2a_{2,m})$ (phase step S37p). The controller 107 sets the obtained phase adjustment amount $X_{min,m}$ in the third-order frequency characteristic compensator 101B3 (phase step S38p). The controller 107 repeats the phase steps S31p to S38p until the phase adjustment amount $X_{min,m}$ is set in all the distortion component bands (phase step S39p). The process may be changed such that, if judgment made in the phase step S35p is No, the phase step S34p is executed.

Figure 21:
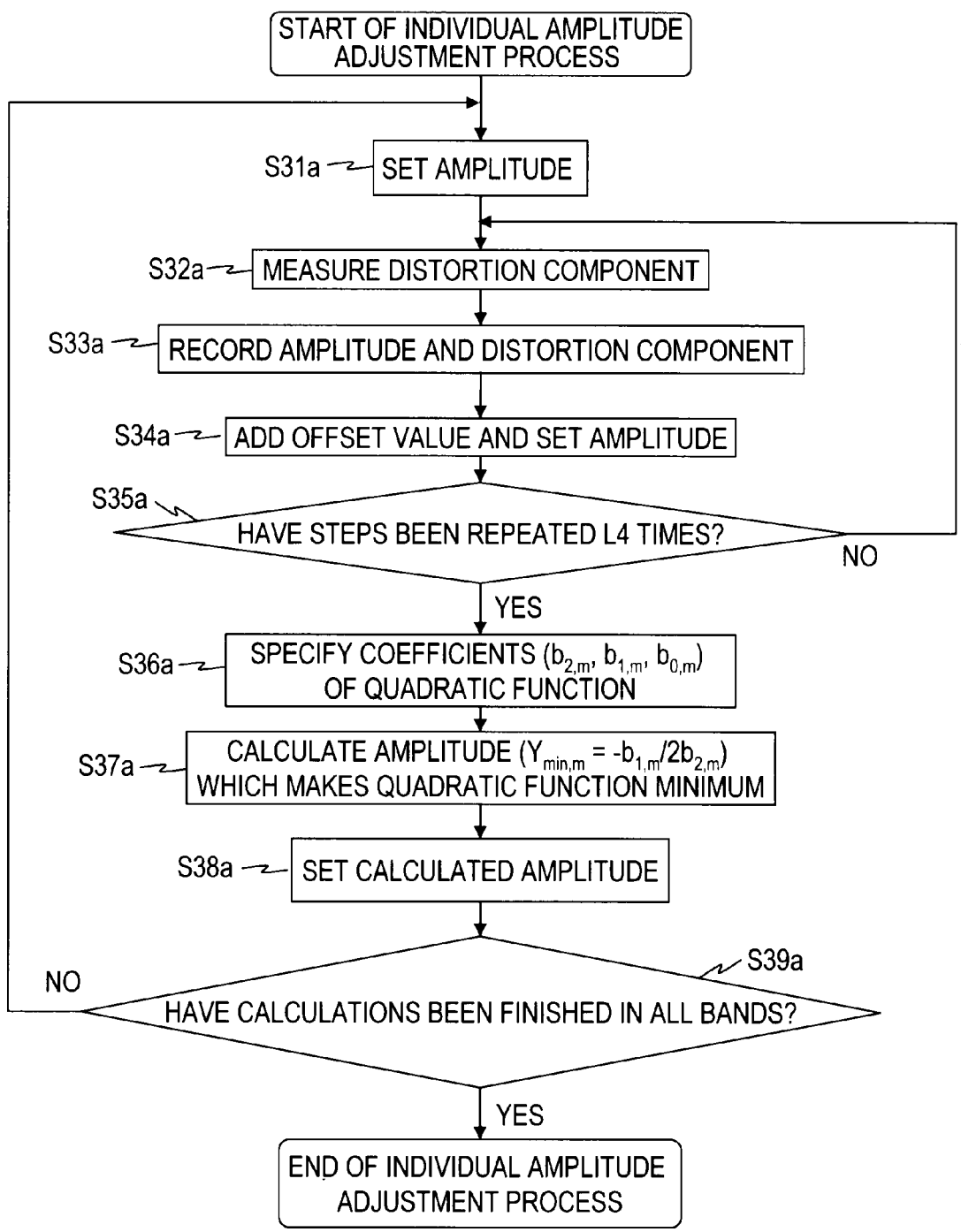
FIG. 21 is a flowchart of an individual amplitude adjustment process 1 in the fourth embodiment.

If the individual phase adjustment process 1 is performed, the individual amplitude adjustment process is performed as illustrated in a flowchart shown in FIG. 21 (this process will be referred to as individual amplitude adjustment process 1).

Individual Amplitude Adjustment Process 1

The controller 107 sets the amplitude adjustment amount $Y_m$ in the band m (amplitude step S31a). The distortion observer 106 measures the distortion component power $D_m$ in the band m (amplitude step S32a). The controller 107 records the set amplitude adjustment amount $Y_m$ and the measured power $D_m$ as $R9_{m,l4}$ and $R10_{m,l4}$ ($0 < l4 \leq L4$) (amplitude step S33a). The controller 107 adds an offset value $B3_m$ ($B3_m > 0$) to the amplitude adjustment amount $Y_m$ and sets the new amplitude adjustment amount $Y_m$ in the band m (amplitude step S34a). The amplitude steps S31a to S34a are repeated L4 times (L4 is an integer equal to or larger than 3) (amplitude step S35a). When the amplitude adjustment amount is larger than 0, a negative offset value may be added to the amplitude adjustment amount in the amplitude step S34a. When the amplitude steps S32a to S34a are executed L4 times, the controller 107 specifies the coefficients ($b_{2,m}$, $b_{1,m}$, $b_{0,m}$) of a quadratic function ($D_m = b_{2,m} Y^2_m + b_{1,m} Y_m + b_{0,m}$) representing the relationship between the amplitude adjustment amount $Y_m$ and the distortion component $D_m$, by using $R9_{m,l4}$ and $R10_{m,l4}$, by the least squares method (amplitude step S36a). The controller 107 calculates the amplitude adjustment amount $Y_{min,m}$ that minimizes the quadratic function, as $-b_{1,m}/(2b_{2,m})$ (amplitude step S37a). The controller 107 sets the obtained amplitude adjustment amount $Y_{min,m}$ in the third-order frequency characteristic compensator 101B3 (amplitude step S38a). The controller 107 repeats the amplitude steps S31a to S38a until the amplitude adjustment amount $Y_{min,m}$ is set in all the distortion component bands (amplitude step S39a).

Figure 22:
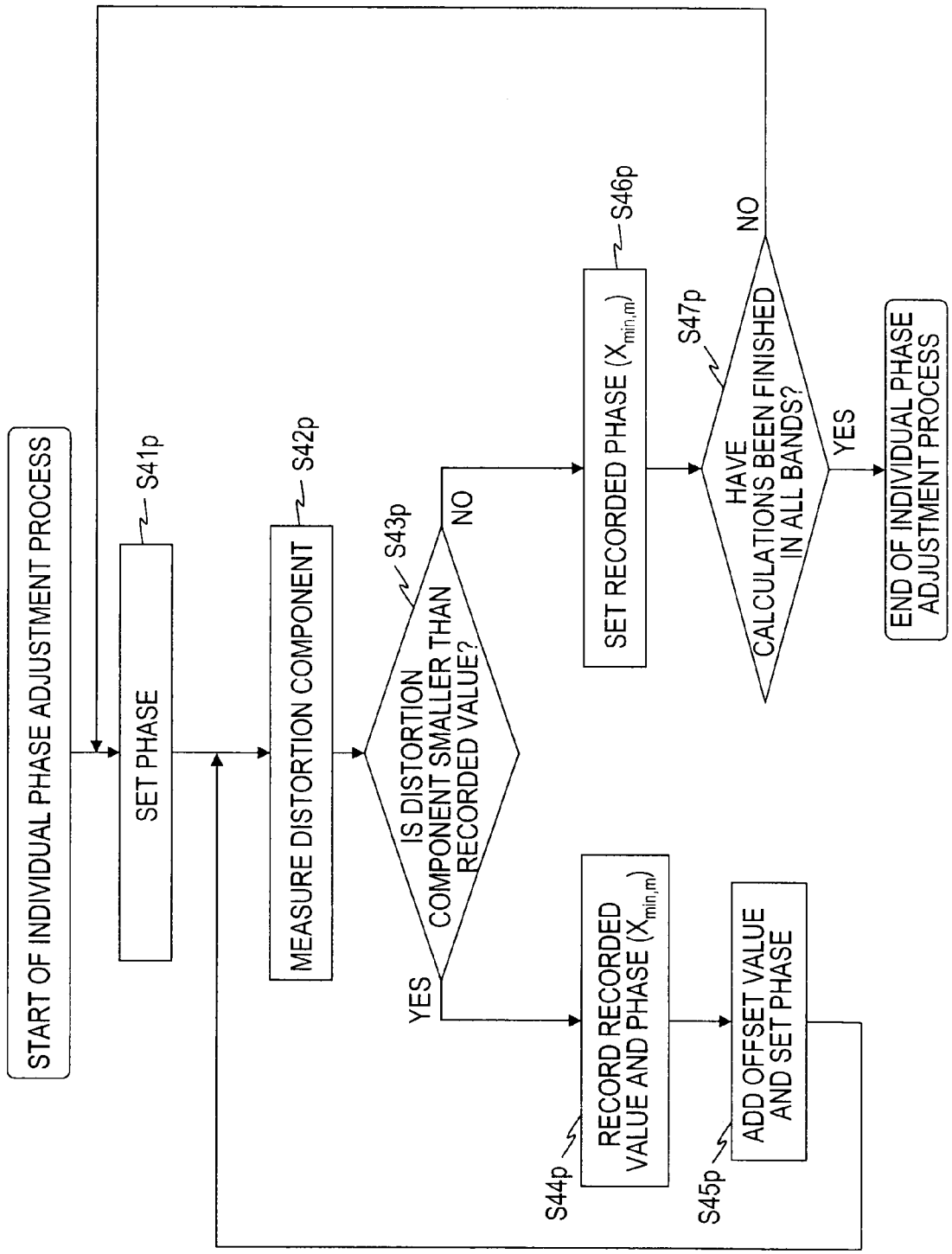
FIG. 22 is a flowchart of an individual phase adjustment process 2 in the fourth embodiment.

The individual phase adjustment process may be as illustrated in a flowchart shown in FIG. 22 (this process will be referred to as individual phase adjustment process 2).

Individual Phase Adjustment Process 2

The controller 107 sets the phase adjustment amount $X_m$ in the band m (phase step S41p). The distortion observer 106 measures the distortion component power $D_m$ in the band m (phase step S42p). The controller 107 compares the distortion component power $D_m$ with a recorded value $R11_m$ (phase step S43p). If the distortion component power $D_m$ falls below the recorded value $R11_m$, the controller 107 records the phase adjustment amount $X_m$ as $X_{min,m}$ and the distortion component power $D_m$ as the recorded value $R11_m$ (phase step S44p). The initial value of the recorded value $R11_m$ is set to a value higher than the highest distortion component power $D_m$ that can be measured. This causes the phase step S44p to be performed once at least and the phase adjustment amount $X_{min,m}$ to be recorded. The controller 107 adds the offset value $A4_m$ ($A4_m > 0$) to the phase adjustment amount $X_m$, sets the new phase adjustment amount $X_m$ in the band m (phase step S45p), and returns to the phase step S42p. In that step, a negative offset value may be added to the phase adjustment amount. If the distortion component power $D_m$ becomes equal to or higher than the recorded value $R11_m$, the controller 107 sets the recorded phase adjustment amount $X_{min,m}$ in the band m (phase step S46p). The controller 107 repeats the processes until the phase adjustment amount $X_{min,m}$ is set in all the distortion component bands (phase step S47p).

Figure 23:
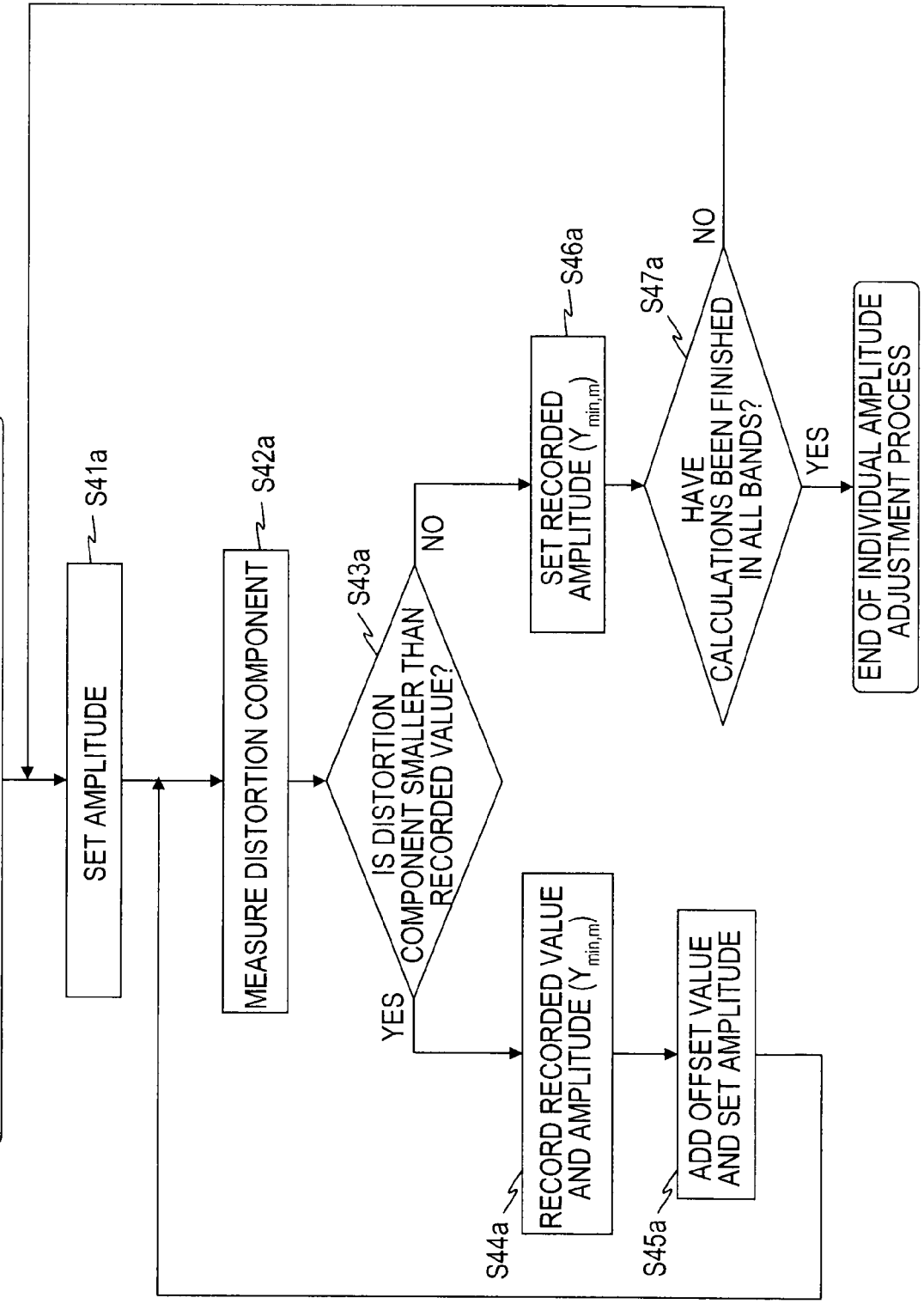
FIG. 23 is a flowchart of an individual amplitude adjustment process 2 in the fourth embodiment.

The individual amplitude adjustment process may be as illustrated in a flowchart shown in FIG. 23 (this process will be referred to as individual amplitude adjustment process 2).

Individual Amplitude Adjustment Process 2

The controller 107 sets the amplitude adjustment amount $Y_m$ of the band m (amplitude step S41a). The distortion observer 106 measures the distortion component power $D_m$ in the band m (amplitude step S42a). The controller 107 compares the distortion component power $D_m$ with a recorded value $R12_m$ (amplitude step S43a). If the distortion component power $D_m$ is smaller than the recorded value $R12_m$, the controller 107 records the amplitude adjustment amount $Y_m$ as $Y_{min,m}$ and the distortion component power $D_m$ as the recorded value $R12_m$ (amplitude step S44a). The initial value of the recorded value $R12_m$ is set to a value higher than the highest distortion component power $D_m$ that can be measured. This causes the amplitude step S44a to be performed once at least and the amplitude adjustment value $Y_{min,m}$ to be recorded. The controller 107 adds the offset value $B4_m$ to the amplitude adjustment amount $Y_m$, sets the new amplitude adjustment amount $Y_m$ in the band m (amplitude step S45a), and returns to the amplitude step S42a. If the amplitude adjustment amount is larger than 0, a negative offset value may be added to the amplitude adjustment amount. When the distortion component power $D_m$ is equal to or larger than the recorded value $R12_m$, the controller 107 sets the recorded amplitude adjustment amount $Y_{min,m}$ in the band m (amplitude step S46a). The controller 107 repeats the processes described above until the amplitude adjustment amount $Y_{min,m}$ is set in all the distortion component bands (amplitude step S47a).

The fourth embodiment may be modified such that, in the collective adjustments made in all the bands as in the third embodiment, the collective phase adjustment process and/or the collective amplitude adjustment process is changed after the first repetition judgment process; and/or, in the adjustment made in one band after another, the individual phase adjustment process and/or the individual amplitude adjustment process is changed after the second repetition judgment process.

Modification

Figure 24:
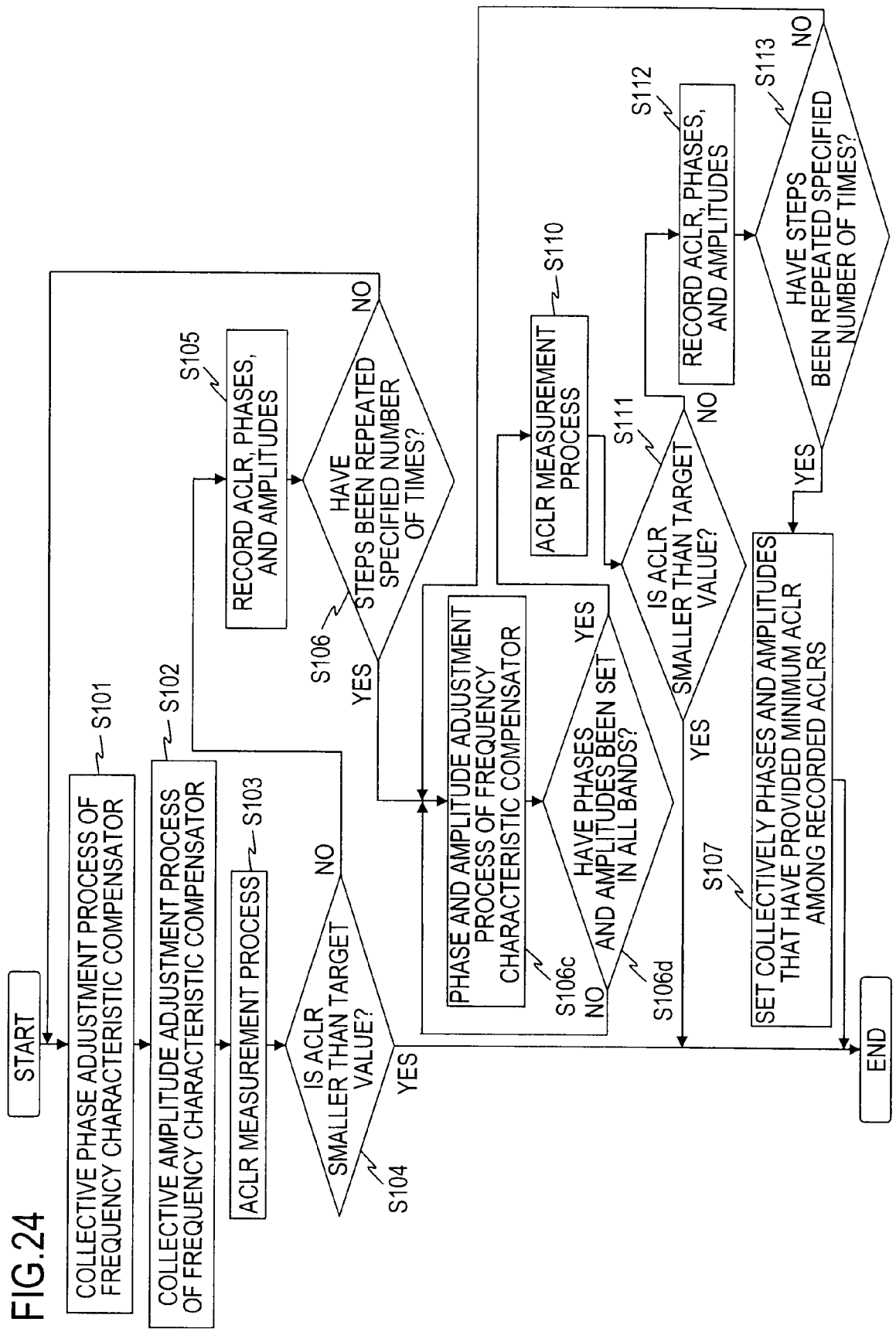
FIG. 24 is a flowchart of processing in a modification of the fourth embodiment.

A modification of the fourth embodiment will be described with reference to FIG. 24. This modification differs from the fourth embodiment in that the third-order frequency characteristic compensator 101B3 sets a phase adjustment amount and an amplitude adjustment amount in one band and then sets a phase adjustment amount and an amplitude adjustment amount in another band (S106c, S106d). In the modification, ACLR can be brought to a value smaller than the target value with a smaller number of repetitions than when the amplitude adjustment amounts are adjusted in all the bands after the phase adjustment amounts are adjusted in all the bands, as in the fourth embodiment. The phase adjustment and the amplitude adjustment may be made in that order or in reverse order.

Figure 25:
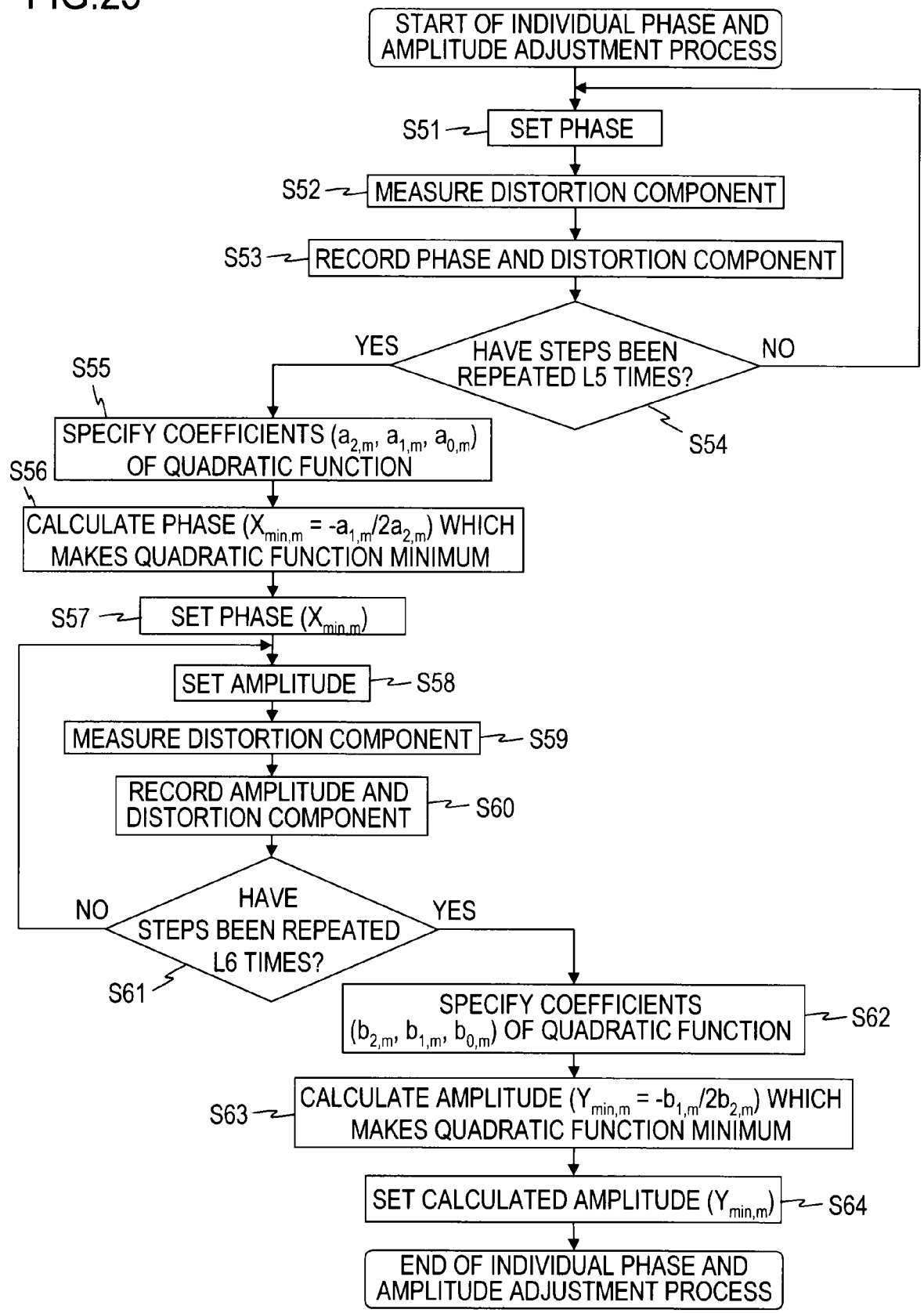
FIG. 25 is a flowchart of an individual phase and amplitude adjustment process 1 in the modification of the fourth embodiment.

The phase and amplitude adjustment process will be described with reference to FIG. 25 (this process will be referred to as individual phase and amplitude adjustment process 1). The phase adjustment amount to be specified in each of M divided bands of the third-order frequency characteristic compensator 101B3 is denoted by $X_{m,l5}$ ($0<m \leq M$, $0<l5 \leq L5$); the amplitude adjustment amount is denoted by $Y_{m,l6}$ ($0<l6 \leq L6$); and the distortion component power in the divided band is denoted by $D_m$.

Individual Phase and Amplitude Adjustment Process 1

The controller 107 sets the phase adjustment amount $X_{m,l5}$ in the band m (phase and amplitude step S51). The distortion observer 106 measures the distortion component power $D_m$ in the band m (phase and amplitude step S52). The controller 107 records the set phase adjustment amount $X_{m,l5}$ and the measured power $D_m$ as $R13_{m,l5}$ and $R14_{m,l5}$, respectively (phase and amplitude step S53). The controller 107 repeats the phase and amplitude steps S51 to S53 until the distortion component power $D_m$ is measured for L5 different phase adjustment amounts $X_{m,l5}$ (L5 is an integer larger than 2) (phase and amplitude step S54). After the distortion component power $D_m$ is measured for L5 different phases $X_m$ the controller 107 specifies the coefficients ($a_{2,m}$, $a_{1,m}$, $a_{0,m}$) of a quadratic function ($D_m = a_{2,m} X^2_m + a_{1,m} X_m + a_{0,m}$) representing the relationship between the phase adjustment amount $X_m$ and the distortion component $D_m$, by using the recorded values $R13_{m,l5}$ and $R14_{m,l5}$, by the least squares method (phase and amplitude step S55). The controller 107 calculates the phase adjustment amount $X_{min,m}$ that minimizes the quadratic function, as $-a_{1,m}/(2a_{2,m})$ (phase and amplitude step S56). The controller 107 sets the obtained phase adjustment amount $X_{min,m}$ in the band m (phase and amplitude step S57). Then, the controller 107 sets the amplitude adjustment amount $Y_{m,l6}$ in the band m (phase and amplitude step S58). The distortion observer 106 measures the distortion component power $D_m$ in the band m (phase and amplitude step S59). The controller 107 records the set amplitude adjustment amount $Y_{m,l6}$ and the measured power $D_m$ as $R15_{m,l6}$ and $R16_{m,l6}$, respectively (phase and amplitude step S60). The controller 107 repeats the phase and amplitude steps S58 to S60 until the distortion component power $D_m$ is measured for L6 different amplitude adjustment amounts $Y_{m,l6}$ (L6 is an integer larger than 2) (phase and amplitude step S61). After the distortion component power $D_m$ is measured for L6 different amplitude adjustment amounts $Y_{m,l6}$, the controller 107 specifies the coefficients ($b_{2,m}$, $b_{1,m}$, $b_{0,m}$) of a quadratic function ($D_m = b_{2,m} Y^2_m + b_{1,m} Y_m + b_{0,m}$) representing the relationship between the amplitude adjustment amount $Y_m$ and the distortion component $D_m$, by using the recorded values $R15_{m,l6}$ and $R16_{m,l6}$, by the least squares method (phase and amplitude step S62). The controller 107 calculates the amplitude adjustment amount $Y_{min,m}$ that minimizes the quadratic function, as $-b_{1,m}/(2b_{2,m})$ (phase and amplitude step S63). The controller 107 sets the obtained amplitude adjustment amount $Y_{min,m}$ in the band m (phase and amplitude step S64).

Figure 26:
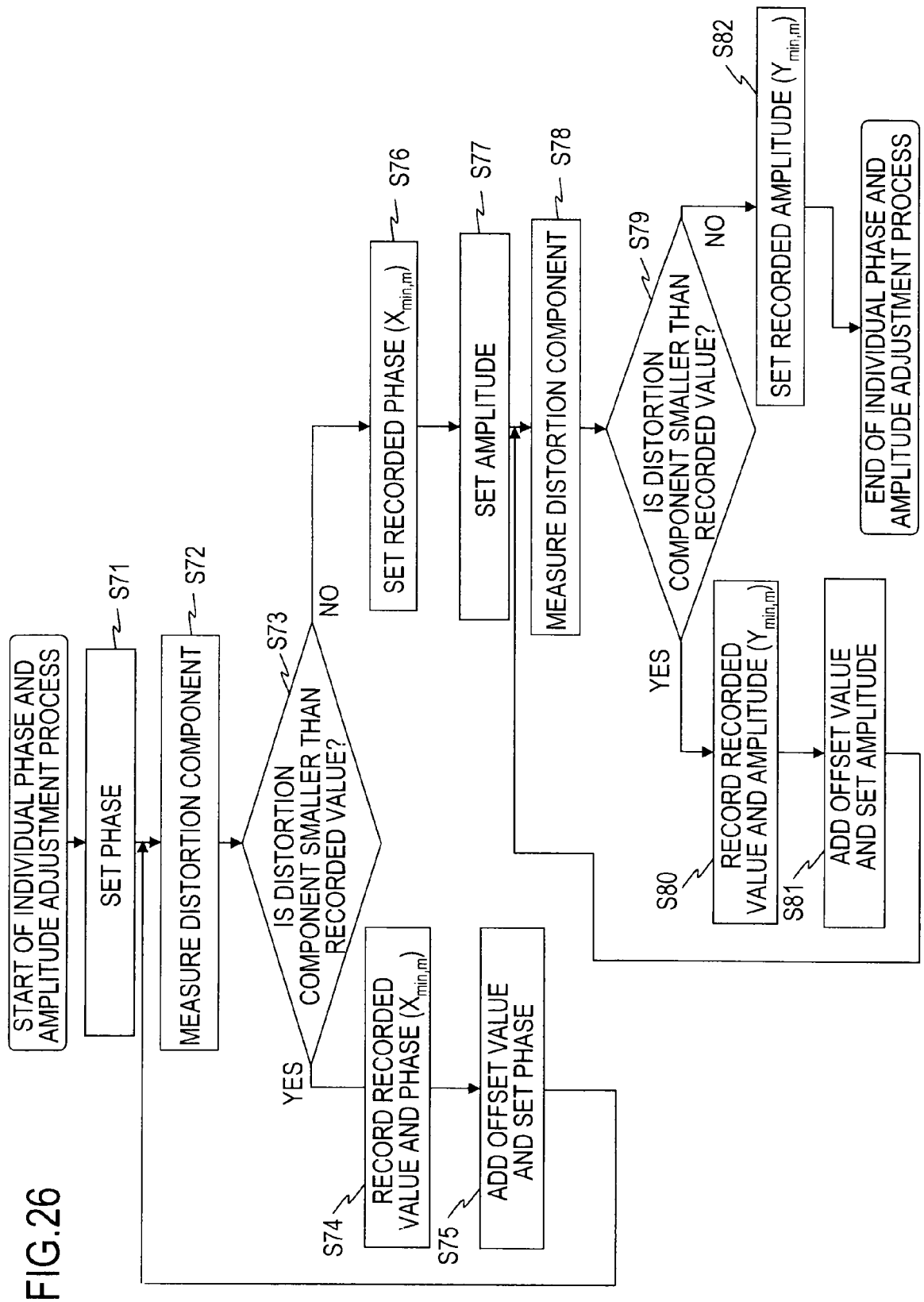
FIG. 26 is a flowchart of an individual phase and amplitude adjustment process 2 in the modification of the fourth embodiment.

The individual phase and amplitude adjustment process may be as illustrated in a flowchart shown in FIG. 26 (this process will be referred to as individual phase and amplitude adjustment process 2). In the description given below, $X_m$ ($0<m \leq M$) and $Y_m$ ($0<m \leq M$) respectively denote the phase adjustment amount and the amplitude adjustment amount to be specified in each of the M divided bands of the third-order frequency characteristic compensator 101B3.

Individual Phase and Amplitude Adjustment Process 2

The controller 107 sets the phase adjustment amount $X_m$ in the band m (phase and amplitude step S71). The distortion observer 106 measures the distortion component power $D_m$ in the band m (phase and amplitude step S72). The controller 107 compares the distortion component power $D_m$ with a recorded value $R17_m$ (phase and amplitude step S73). If the distortion component power $D_m$ falls below the recorded value $R17_m$, the controller 107 records the phase adjustment amount $X_m$ as $X_{min,m}$ and the distortion component power $D_m$ as $R17_m$ (phase and amplitude step S74). The initial value of $R17_m$ is set to a value higher than the highest distortion component power $D_m$ that can be measured. This causes the phase and amplitude step S74 to be executed at least once and the phase adjustment amount $X_{min,m}$ to be recorded. The controller 107 adds an offset value $A5_m$ to the phase adjustment amount $X_m$, sets the new phase adjustment amount $X_m$ in the band m (phase and amplitude step S75), and returns to the phase amplitude step S72. If the distortion component power $D_m$ becomes equal to or higher than $R17_m$, the controller 107 sets the recorded phase adjustment amount $X_{min,m}$ in the band m (phase and amplitude step S76). The controller 107 sets the amplitude adjustment amount $Y_n$, in the band m (phase and amplitude step S77). The distortion observer 106 measures the distortion component power $D_m$ in the band m (phase and amplitude step S78). The controller 107 compares the distortion component power $D_m$ with a recorded value $R18_m$ (phase and amplitude step S79). If the distortion component power $D_m$ becomes smaller than the recorded value $R18_m$, the controller 107 records the amplitude adjustment amount $Y_n$, as $Y_{min,m}$ and the distortion component power $D_m$ as $R18_m$ (phase and amplitude step S80). The initial value of $R18_m$ is set to a value higher than the highest distortion component power $D_m$ that can be measured. This causes the phase and amplitude step S80 to be performed at least once and the amplitude adjustment amount $Y_{min,m}$ to be recorded. The controller 107 adds an offset value $B5_m$ to the amplitude adjustment amount $Y_m$, sets the new amplitude adjustment amount $Y_m$ in the band m (phase and amplitude step S81), and returns to the phase and amplitude step S78. If the distortion component power $D_m$ becomes equal to or higher than $R18_m$, the controller 107 sets the recorded amplitude adjustment amount $Y_{min,m}$ in the band m (phase and amplitude step S82).

The present invention is not limited to the embodiments described above and can be modified appropriately within the scope of the present invention.

What is claimed is:

1. A power series digital predistorter for adding to an input signal a distortion compensation component for canceling a distortion component generated in a power amplifier, the power series digital predistorter comprising:
   a linear transfer path adapted to transfer the input signal with a delay;
   a distortion generation path comprising:
   an N-th order distortion generator adapted to generate an N-th order distortion component of the input signal;
   an N-th order distortion vector adjuster adapted to adjust the amplitude and the phase of the N-th order distortion component; and
   an N-th order frequency characteristic compensator adapted to divide the output of the N-th order distortion vector adjuster into M bands in a frequency domain and to adjust the amplitude and the phase of the output in each of the M bands; and
   the distortion generation path outputting the output of the N-th order frequency characteristic compensator as the distortion compensation component, where N is a predetermined odd number equal to or larger than three and M is a predetermined integer equal to or larger than two;
   a combiner adapted to combine the output of the linear transfer path and the output of the distortion generation path;
   a distortion observer adapted to observe the distortion component included in the output of the power amplifier, which is adapted to amplify the output of the combiner; and
   a controller adapted to set adjustment amounts for the amplitude and the phase in each of the M bands in the N-th order frequency characteristic compensator according to an observation result of the distortion observer;
   wherein the controller comprises:
   a phase setting unit adapted to collectively set the adjustment amounts for the phases in the M bands in the N-th order frequency characteristic compensator;
   an amplitude setting unit adapted to collectively set the adjustment amounts for the amplitudes in the M bands in the N-th order frequency characteristic compensator; and
   a processing control unit adapted to determine whether an index indicating the degree of cancellation of the distortion component generated in the power amplifier satisfies a preset condition, and, if the index does not satisfy the condition, to perform control such that the phase setting unit again collectively sets the adjustment amounts for the phases and the amplitude setting unit again collectively sets the adjustment amounts for the amplitudes;
   wherein the phase setting unit
   (a1) collectively sets initial adjustment amounts for the phases in the M bands in the N-th order frequency characteristic compensator;
   (a2) records in each of the M bands a combination of the adjustment amount for the phase in each of the M bands, set in the N-th order frequency characteristic compensator, and a distortion component observed in each of the M bands by the distortion observer when the N-th order frequency characteristic compensator adjusts the phase according to the adjustment amount;
   (a3) changes step of changing the adjustment amount for the phase in each of the M bands by a preset offset in each of the M bands;
   (a4) repeats L1 times (a2) and (a3), where L1 is a predetermined integer equal to or larger than three;
   (a5) calculates coefficients $a_2$, $a_1$ and $a_0$ used in a quadratic function expressing the relationship between the adjustment amount x for the phase and the distortion component d, $$d = a_2 x^2 + a_1 x + a_0,$$

in each of the M bands by using the combination recorded in (a2) in each of the M bands;
   (a6) calculates an adjustment amount, $-a_1/(2a_2)$, for the phase which gives the minimum value of the quadratic function in each of the M bands by using the coefficients calculated in (a5); and
   (a7) collectively sets the adjustment amounts for the phases in the M bands calculated in (a6), in the N-th order frequency characteristic compensator.

2. A distortion compensation control method for a power series digital predistorter, the power series digital predistorter including:
   a linear transfer path adapted to transfer an input signal with a delay;
   a distortion generation path including:
   an N-th order distortion generator adapted to generate an N-th order distortion component of the input signal;
   an N-th order distortion vector adjuster adapted to adjust the amplitude and the phase of the N-th order distortion component; and
   an N-th order frequency characteristic compensator adapted to divide the output of the N-th order distortion vector adjuster to M bands in a frequency domain and to adjust the amplitude and the phase of the output in each of the M bands; and
   the distortion generation path outputting the output of the N-th order frequency characteristic compensator as a distortion compensation component, where N is a predetermined odd number equal to or larger than three and M is a predetermined integer equal to or larger than two;
   a combiner adapted to combine the output of the linear transfer path and the output of the distortion generation path;
   a distortion observer adapted to observe a distortion component included in the output of a power amplifier adapted to amplify the output of the combiner; and
   a controller adapted to set adjustment amounts for the amplitude and the phase in each of the M bands in the N-th order frequency characteristic compensator according to an observation result of the distortion observer;
   wherein the distortion compensation control method comprises:
   a phase setting step of collectively setting the adjustment amounts for the phases in the M bands in the N-th order frequency characteristic compensator;
   an amplitude setting step of collectively setting the adjustment amounts for the amplitudes in the M bands in the N-th order frequency characteristic compensator; and
   a processing control step of determining whether an index indicating the degree of cancellation of the distortion component generated in the power amplifier satisfies a preset condition, and, if the index does not satisfy the condition, of performing control such that the phase setting step and the amplitude setting step are performed again;

wherein the phase setting step further comprises:

an initial phase setting step of collectively setting initial adjustment amounts for the phases in the M bands in the N-th order frequency characteristic compensator;

a phase recording step of recording in each of the M bands a combination of the adjustment amount for the phase in each of the M bands, set in the N-th order frequency characteristic compensator, and a distortion component observed in each of the M bands by the distortion observer when the N-th order frequency characteristic compensator adjusts the phase according to the adjustment amount;

a phase adjustment amount changing step of changing the adjustment amount for the phase in each of the M bands by a preset offset in each of the M bands;

a step of repeating L1 times the phase recording step and the phase adjustment amount changing step, where L1 is a predetermined integer equal to or larger than three;

a phase approximation step of calculating coefficients $a_2$ $a_1$ and $a_0$ used in a quadratic function expressing the relationship between the adjustment amount x for the phase and the distortion component d, $$d = a_2 x^2 + a_1 x + a_0,$$

in each of the M bands by using the combination recorded in the phase recording step in each of the M bands;

a phase calculating step of calculating an adjustment amount, $-a_1/(2a_2)$, for the phase which gives the minimum value of the quadratic function in each of the M bands by using the coefficients calculated in the phase approximation step; and a final phase setting step of collectively setting the adjustment amounts for the phases in the M bands calculated in the phase calculating step, in the N-th order frequency characteristic compensator.

3. A distortion compensation control method for a power series digital predistorter, the power series digital predistorter including:

a linear transfer path adapted to transfer an input signal with a delay;

a distortion generation path including:

an N-th order distortion generator adapted to generate an N-th order distortion component of the input signal;

an N-th order distortion vector adjuster adapted to adjust the amplitude and the phase of the N-th order distortion component; and an N-th order frequency characteristic compensator adapted to divide the output of the N-th order distortion vector adjuster to M bands in a frequency domain and to adjust the amplitude and the phase of the output in each of the M bands; and the distortion generation path outputting the output of the N-th order frequency characteristic compensator as a distortion compensation component, where N is a predetermined odd number equal to or larger than three and M is a predetermined integer equal to or larger than two;

a combiner adapted to combine the output of the linear transfer path and the output of the distortion generation path;

a distortion observer adapted to observe a distortion component included in the output of a power amplifier adapted to amplify the output of the combiner; and a controller adapted to set adjustment amounts for the amplitude and the phase in each of the M bands in the N-th order frequency characteristic compensator according to an observation result of the distortion observer;

wherein the distortion compensation control method comprises:

a phase setting step of collectively setting the adjustment amounts for the phases in the M bands in the N-th order frequency characteristic compensator;

an amplitude setting step of collectively setting the adjustment amounts for the amplitudes in the M bands in the N-th order frequency characteristic compensator; and a processing control step of determining whether an index indicating the degree of cancellation of the distortion component generated in the power amplifier satisfies a preset condition, and, if the index does not satisfy the condition, of performing control such that the phase setting step and the amplitude setting step are performed again, wherein the phase setting step further comprises:

an initial phase setting step of collectively setting initial adjustment amounts for the phases in the M bands in the N-th order frequency characteristic compensator;

a phase recording step of recording in each of the M bands a combination of the adjustment amount for the phase in each of the M bands, set in the N-th order frequency characteristic compensator, and a distortion component observed in each of the M bands by the distortion observer when the N-th order frequency characteristic compensator adjusts the phase according to the adjustment amount;

a phase adjustment amount changing step of changing the adjustment amount for the phase in each of the M bands by a preset offset in each of the M bands;

a step of repeating L1 times the phase recording step and the phase adjustment amount changing step, where L1 is a predetermined integer equal to or larger than three;

a cosine deriving step of calculating coefficients $c_2$, $c_1$, and $c_0$ used in a cosine expressing the relationship between the adjustment amount x for the phase and the distortion component d, $$d = c_2 \cos(c_1 - x) + c_0,$$

in each of the M bands by using the combination recorded in the phase recording step in each of the M bands;

a phase calculating step of calculating an adjustment amount, $c_1 - \pi$, for the phase which gives the minimum value of the cosine in each of the M bands by using the coefficients calculated in the cosine deriving step, where the adjustment amount for the phase is expressed in units of radians; and a final phase setting step of collectively setting the adjustment amounts for the phases in the M bands calculated in the phase calculating step, in the N-th order frequency characteristic compensator.

4. A distortion compensation control method for a power series digital predistorter, the power series digital predistorter including:

a linear transfer path adapted to transfer an input signal with a delay;

a distortion generation path including:

an N-th order distortion generator adapted to generate an N-th order distortion component of the input signal;

an N-th order distortion vector adjuster adapted to adjust the amplitude and the phase of the N-th order distortion component; and an N-th order frequency characteristic compensator adapted to divide the output of the N-th order distortion vector adjuster to M bands in a frequency domain and to adjust the amplitude and the phase of the output in each of the M bands; and the distortion generation path outputting the output of the N-th order frequency characteristic compensator as a distortion compensation component, where N is a predetermined odd number equal to or larger than three and M is a predetermined integer equal to or larger than two;

a combiner adapted to combine the output of the linear transfer path and the output of the distortion generation path;

a distortion observer adapted to observe a distortion component included in the output of a power amplifier adapted to amplify the output of the combiner; and a controller adapted to set adjustment amounts for the amplitude and the phase in each of the M bands in the N-th order frequency characteristic compensator according to an observation result of the distortion observer;

wherein the distortion compensation control method comprises:

a phase setting step of collectively setting the adjustment amounts for the phases in the M bands in the N-th order frequency characteristic compensator;

an amplitude setting step of collectively setting the adjustment amounts for the amplitudes in the M bands in the N-th order frequency characteristic compensator; and a processing control step of determining whether an index indicating the degree of cancellation of the distortion component generated in the power amplifier satisfies a preset condition, and, if the index does not satisfy the condition, of performing control such that the phase setting step and the amplitude setting step are performed again, wherein the phase setting step further comprises:

an initial phase setting step of collectively setting initial adjustment amounts for the phases in the M bands in the N-th order frequency characteristic compensator;

a phase determination step of determining whether a distortion component observed in each of the M bands by the distortion observer when the N-th order frequency characteristic compensator adjusts the phase according to the adjustment amount for the phase set in each of the M bands in the N-th order frequency characteristic compensator is equal to or smaller than the currently recorded value of the distortion component or is smaller than the currently recorded value of the distortion component;

a phase updating step of, if one or more defective bands where the distortion component observed is equal to or smaller than the currently recorded value or is smaller than the currently recorded value are found in the M bands in the phase determination step, updating the currently recorded value of the adjustment amount for the phase to the adjustment value for the phase currently set in the N-th order frequency characteristic compensator in each of the defective bands, updating the currently recorded value of the distortion component to the distortion component observed, in each of the defective bands, and changing the adjustment amount for the phase in each of the defective bands by a preset offset; and a final phase setting step of collectively setting the adjustment amounts currently recorded for the phases in the M bands in the N-th order frequency characteristic compensator if no defective band is found in the phase determination step.

5. The distortion compensation control method for the power series digital predistorter according to one of claims 2, 3 and 4, wherein the amplitude setting step further comprises:

an initial amplitude setting step of collectively setting initial adjustment amounts for the amplitudes in the M bands in the N-th order frequency characteristic compensator;

an amplitude determination step of determining whether a distortion component observed in each of the M bands by the distortion observer when the N-th order frequency characteristic compensator adjusts the amplitude according to the adjustment amount for the amplitude set in each of the M bands in the N-th order frequency characteristic compensator is equal to or smaller than the currently recorded value of the distortion component or is smaller than the currently recorded value of the distortion component;

an amplitude updating step of, if one or more defective bands where the distortion component observed is equal to or smaller than the currently recorded value or is smaller than the currently recorded value are found in the M bands in the amplitude determination step, updating the currently recorded value of the adjustment amount for the amplitude to the adjustment value for the amplitude currently set in the N-th order frequency characteristic compensator in each of the defective bands, updating the currently recorded value of the distortion component to the distortion component observed, in each of the defective bands, and changing the adjustment amount for the amplitude in each of the defective bands by a preset offset; and a final amplitude setting step of collectively setting the adjustment amounts currently recorded for the amplitudes in the M bands in the N-th order frequency characteristic compensator if no defective band is found in the amplitude determination step.

6. The distortion compensation control method for the power series digital predistorter according to one of claims 2, 3 and 4, wherein the amplitude setting step further comprises:

an initial amplitude setting step of collectively setting initial adjustment amounts for the amplitudes in the M bands in the N-th order frequency characteristic compensator;

an amplitude recording step of recording in each of the M bands a combination of the adjustment amount for the amplitude in each of the M bands, set in the N-th order frequency characteristic compensator, and a distortion component observed in each of the M bands by the distortion observer when the N-th order frequency characteristic compensator adjusts the amplitude according to the adjustment amount;

an amplitude adjustment amount changing step of changing the adjustment amount for the amplitude in each of the M bands by a preset offset in each of the M bands;

a step of repeating L2 times the amplitude recording step and the amplitude adjustment amount changing step, where L2 is a predetermined integer equal to or larger than three;

an amplitude step of calculating coefficients $b_2$, $b_1$, and $b_0$ used in a quadratic function expressing the relationship between the adjustment amount y for the amplitude and the distortion component d, $$d = b_2 y^2 + b_1 y + b_0,$$

in each of the M bands by using the combination recorded in the amplitude recording step in each of the M bands;

an amplitude calculating step of calculating an adjustment amount, $-b_1/(2b_2)$, for the amplitude which gives the minimum value of the quadratic function in each of the M bands by using the coefficients calculated in the amplitude step; and a final amplitude setting step of collectively setting the adjustment amounts for the amplitudes in the M bands calculated in the amplitude calculating step, in the N-th order frequency characteristic compensator.

7. A power series digital predistorter for adding to an input signal a distortion compensation component for canceling a distortion component generated in a power amplifier, the power series digital predistorter comprising:

a linear transfer path adapted to transfer the input signal with a delay;

a distortion generation path comprising:
an N-th order distortion generator adapted to generate an N-th order distortion component of the input signal;
an N-th order distortion vector adjuster adapted to adjust the amplitude and the phase of the N-th order distortion component; and
an N-th order frequency characteristic compensator adapted to divide the output of the N-th order distortion vector adjuster into M bands in a frequency domain and to adjust the amplitude and the phase of the output in each of the M bands; and
the distortion generation path outputting the output of the N-th order frequency characteristic compensator as the distortion compensation component, where N is a predetermined odd number equal to or larger than three and M is a predetermined integer equal to or larger than two;

a combiner adapted to combine the output of the linear transfer path and the output of the distortion generation path;

a distortion observer adapted to observe the distortion component included in the output of the power amplifier, which is adapted to amplify the output of the combiner; and a controller adapted to set adjustment amounts for the amplitude and the phase in each of the M bands in the N-th order frequency characteristic compensator according to an observation result of the distortion observer;

wherein the controller comprises:
a phase setting unit adapted to collectively set the adjustment amounts for the phases in the M bands in the N-th order frequency characteristic compensator;
an amplitude setting unit adapted to collectively set the adjustment amounts for the amplitudes in the M bands in the N-th order frequency characteristic compensator; and
a processing control unit adapted to determine whether an index indicating the degree of cancellation of the distortion component generated in the power amplifier satisfies a preset condition, and, if the index does not satisfy the condition, to perform control such that the phase setting unit again collectively sets the adjustment amounts for the phases and the amplitude setting unit again collectively sets the adjustment amounts for the amplitudes;

wherein the phase setting unit further adapted to peroform
(a1) an initial phase setting step of collectively setting initial adjustment amounts for the phases in the M bands in the N-th order frequency characteristic compensator;
(a2) a phase recording step of recording in each of the M bands a combination of the adjustment amount for the phase in each of the M bands, set in the N-th order frequency characteristic compensator, and a distortion component observed in each of the M bands by the distortion observer when the N-th order frequency characteristic compensator adjusts the phase according to the adjustment amount;
(a3) a phase adjustment amount changing step of changing the adjustment amount for the phase in each of the M bands by a preset offset in each of the M bands;
(a4) a step of repeating L1 times (a2) and (a3), where L1 is a predetermined integer equal to or larger than three;
(a5) a cosine deriving step of calculating coefficients $c_2$, $c_1$, and $c_0$ used in a cosine expressing the relationship between the adjustment amount x for the phase and the distortion component d, $$d=c_2 \cos(c_1-x)+c_0,$$

in each of the M bands by using the combination recorded in (a2) in each of the M bands;
(a6) a phase calculating step of calculating an adjustment amount, $c_1-\pi$, for the phase which gives the minimum value of the cosine in each of the M bands by using the coefficients calculated in (a5), where the adjustment amount for the phase is expressed in units of radians; and
(a7) a final phase setting step of collectively setting the adjustment amounts for the phases in the M bands calculated in (a6), in the N-th order frequency characteristic compensator.

8. A power series digital predistorter for adding to an input signal a distortion compensation component for canceling a distortion component generated in a power amplifier, the power series digital predistorter comprising:

a linear transfer path adapted to transfer the input signal with a delay;

a distortion generation path comprising:
an N-th order distortion generator adapted to generate an N-th order distortion component of the input signal;
an N-th order distortion vector adjuster adapted to adjust the amplitude and the phase of the N-th order distortion component; and
an N-th order frequency characteristic compensator adapted to divide the output of the N-th order distortion vector adjuster into M bands in a frequency domain and to adjust the amplitude and the phase of the output in each of the M bands; and
the distortion generation path outputting the output of the N-th order frequency characteristic compensator as the distortion compensation component, where N is a predetermined odd number equal to or larger than three and M is a predetermined integer equal to or larger than two;

a combiner adapted to combine the output of the linear transfer path and the output of the distortion generation path;

a distortion observer adapted to observe the distortion component included in the output of the power amplifier, which is adapted to amplify the output of the combiner; and a controller adapted to set adjustment amounts for the amplitude and the phase in each of the M bands in the N-th order frequency characteristic compensator according to an observation result of the distortion observer;

wherein the controller comprises:
a phase setting unit adapted to collectively set the adjustment amounts for the phases in the M bands in the N-th order frequency characteristic compensator;
an amplitude setting unit adapted to collectively set the adjustment amounts for the amplitudes in the M bands in the N-th order frequency characteristic compensator; and a processing control unit adapted to determine whether an index indicating the degree of cancellation of the distortion component generated in the power amplifier satisfies a preset condition, and, if the index does not satisfy the condition, to perform control such that the phase setting unit again collectively sets the adjustment amounts for the phases and the amplitude setting unit again collectively sets the adjustment amounts for the amplitudes;

wherein the phase setting unit (a1) collectively sets initial adjustment amounts for the phases in the M bands in the N-th order frequency characteristic compensator;

(a2) determines whether a distortion component observed in each of the M bands by the distortion observer when the N-th order frequency characteristic compensator adjusts the phase according to the adjustment amount for the phase set in each of the M bands in the N-th order frequency characteristic compensator is equal to or smaller than the currently recorded value of the distortion component or is smaller than the currently recorded value of the distortion component;

(a3) if one or more defective bands where the distortion component observed is equal to or smaller than the currently recorded value or is smaller than the currently recorded value are found in the M bands in (a2), updates the currently recorded value of the adjustment amount for the phase to the adjustment value for the phase currently set in the N-th order frequency characteristic compensator in each of the defective bands, updates the currently recorded value of the distortion component to the distortion component observed, in each of the defective bands, and changes the adjustment amount for the phase in each of the defective bands by a preset offset; and (a4) collectively sets the adjustment amounts currently recorded for the phases in the M bands in the N-th order frequency characteristic compensator if no defective band is found in (a2).

* * * * *

UNITED STATES PATENT AND TRADEMARK OFFICE
CERTIFICATE OF CORRECTION

| | | |
|---|---|---|
| PATENT NO. | : 8,594,231 B2 | Page 1 of 1 |
| APPLICATION NO. | : 12/868063 | |
| DATED | : November 26, 2013 | |
| INVENTOR(S) | : Junya Ohkawara et al. | |

It is certified that error appears in the above-identified patent and that said Letters Patent is hereby corrected as shown below:

On the title page, Item (45), the Terminal Disclaimer should read:

--(45)   Date of Patent:   * Nov. 26, 2013

(*) Notice:   Subject to any disclaimer, the term of this
Patent is extended or adjusted under 35
U.S.C. 154(b) by 397 days.

This patent is subject to a terminal disclaimer.--

Signed and Sealed this
Eighteenth Day of February, 2014

Michelle K. Lee
*Deputy Director of the United States Patent and Trademark Office*